United States Patent [19]

Takiff et al.

[11] Patent Number: 5,401,607
[45] Date of Patent: Mar. 28, 1995

[54] PROCESSES AND COMPOSITIONS FOR PHOTOGENERATION OF ACID

[75] Inventors: Larry C. Takiff; Stephen J. Telfer; Kenneth C. Waterman, all of Arlington, Mass.

[73] Assignee: Polaroid Corporation, Cambridge, Mass.

[21] Appl. No.: 84,759

[22] Filed: Jun. 29, 1993

Related U.S. Application Data

[63] Continuation-in-part of Ser. No. 686,502, Apr. 17, 1991, Pat. No. 5,227,277.

[51] Int. Cl.$^6$ .............................................. G03C 3/00
[52] U.S. Cl. ...................................... 430/253; 430/269; 430/270; 430/340; 430/333; 430/336
[58] Field of Search ............... 430/253, 270, 203, 269, 430/340, 346, 336, 333, 944, 945; 204/157.45; 549/331, 332

[56] References Cited

U.S. PATENT DOCUMENTS

| | | | |
|---|---|---|---|
| 3,487,764 | 1/1970 | Borden et al. | 96/28 |
| 3,617,270 | 11/1971 | Kampfer | 430/62 |
| 3,890,152 | 6/1975 | Ruckert et al. | 96/75 |
| 3,915,704 | 10/1975 | Limburg et al. | 96/27 R |
| 3,915,706 | 10/1975 | Limburg et al. | 96/27 R |
| 3,917,483 | 11/1975 | Limburg et al. | 96/27 R |
| 3,923,514 | 12/1975 | Marsh | 96/35 |
| 3,932,514 | 1/1976 | Thelen et al. | 260/586 P |
| 3,964,907 | 2/1976 | Fech, Jr. et al. | 427/43 |
| 4,081,282 | 3/1978 | Merrill et al. | 96/77 |
| 4,092,146 | 5/1978 | Fischer et al. | 71/70 |
| 4,123,309 | 10/1978 | Perrington et al. | 156/234 |
| 4,123,578 | 10/1978 | Perrington et al. | 428/206 |
| 4,145,216 | 3/1979 | Merrill et al. | 96/28 |
| 4,157,412 | 6/1979 | Deneau | 428/147 |
| 4,159,387 | 6/1979 | Bellus | 560/185 |
| 4,210,711 | 7/1981 | Kitajima et al. | 430/253 |
| 4,284,703 | 8/1981 | Inoue et al. | 430/253 |
| 4,345,017 | 8/1982 | Cournoyer et al. | 430/221 |
| 4,356,252 | 10/1982 | Lee | 430/270 |
| 4,508,811 | 4/1985 | Gravesteijn et al. | 430/270 |
| 4,602,263 | 7/1986 | Borrer et al. | 346/201 |
| 4,720,449 | 1/1988 | Borrer et al. | 430/338 |
| 4,806,451 | 2/1989 | Froehlich | 430/291 |
| 4,826,976 | 5/1989 | Borrer et al. | 544/58.4 |
| 4,857,437 | 8/1989 | Banks et al. | 430/270 |
| 4,910,120 | 3/1990 | Platzer et al. | 430/253 |
| 4,916,046 | 4/1990 | Doessel | 430/281 |
| 4,992,571 | 2/1991 | Fukuyama et al. | 566/64 |
| 5,037,575 | 8/1991 | Miura et al. | 430/70 |
| 5,055,376 | 10/1991 | Saeva | 430/270 |
| 5,084,371 | 1/1992 | Schwalm et al. | 430/270 |
| 5,102,771 | 4/1992 | Vogel et al. | 430/270 |
| 5,141,969 | 8/1992 | Saeva et al. | 430/270 |
| 5,147,758 | 9/1992 | Smothers et al. | 430/281 |
| 5,166,024 | 11/1992 | Bugner et al. | 430/70 |
| 5,190,849 | 2/1993 | Santoh et al. | 430/270 |
| 5,200,297 | 4/1993 | Kelly | 430/253 |
| 5,219,703 | 6/1993 | Bugner et al. | 430/200 |
| 5,219,709 | 6/1993 | Nagasaka et al. | 430/281 |
| 5,227,498 | 7/1993 | Lee et al. | 549/404 |
| 5,227,499 | 7/1993 | McGowan et al. | 549/404 |
| 5,231,190 | 7/1993 | McGowan et al. | 549/13 |

FOREIGN PATENT DOCUMENTS 824630 10/1969 Canada .
292323 11/1988 European Pat. Off. .

(List continued on next page.)

OTHER PUBLICATIONS

Berkower et al., Photopolymer Image Transfer Rheology, Photog. Sci. Eng., 12(6), 283 (1968).

(List continued on next page.)

*Primary Examiner*—Charles L. Bowers, Jr.
*Assistant Examiner*—Geraldine Letscher
*Attorney, Agent, or Firm*—David J. Cole

[57] ABSTRACT

An infra-red sensitive acid-generating medium comprises a binder, an iodonium salt; and a squarylium dye capable of absorbing infra-red radiation having a wavelength within the range of about 700 to about 1200 nm, the dye having a squarylium ring the 1- and 3-positions of which are each connected, via a single sp$^2$ carbon atom, to a pyrylium, thiopyrylium, benzpyrylium or benzthiopyrylium nucleus, at least one of the sp$^2$ carbon atoms having a hydrogen atom attached thereto, and the 2-position of the squarylium ring bearing an O$^-$, amino or substituted amino, or sulfonamido group.

24 Claims, 5 Drawing Sheets

FOREIGN PATENT DOCUMENTS

| | | |
|---|---|---|
| 423446 | 4/1991 | European Pat. Off. . |
| 2135792 | 12/1972 | France . |
| 62-237349 | 10/1987 | Japan . |
| 62-247348 | 10/1987 | Japan . |
| WO88/04237 | 6/1988 | WIPO . |
| WO92/11581 | 7/1992 | WIPO . |
| WO92/11582 | 7/1992 | WIPO . |
| WO93/09956 | 5/1993 | WIPO . |

OTHER PUBLICATIONS

Berry et al., Chemically Amplified Resists for I-line and G-line Applications, SPIE 1262, 575 (1990).

Bou et al., Tetrahedron Letters, 23(3), 361 (1982).

Busman et al., Peel-Apart Imaging Systems Based on Photoactivated Surfactants, J. Imaging. Tech., 11(4), 191 (1985).

Cohen S. and Cohen, S. G., J. Am. Chem. Soc., 88, 5433 (1966).

Crivello et al., J. Polym. Sci., Polym. Chem. Ed., 16, 2441 (1978).

Crivello et al., J. Polym. Sci., Polym. Chem. Ed., 17, 977, 1047 and 2877 (1979).

Crivello et al., J. Polym. Sci., Polym. Chem. Ed., 18, 1021 (1980).

Crivello et al., Macromol., 10, 1307 (1977).

Dehmlow et al., Chem. Ber. 113(1), 1–8 (1979).

Dehmlow et al., Chem. Ber. 121(3), 569–71 (1988).

Devoe et al., Can. J. Chem., 66, 319 (1988).

Fotland, J. Phot. Sci., 18, 33 (1970).

Frechet, J. M. J. et al, J. Imaging Sci., 30(2), 59 (1986).

Islam, N. et al., Tetrahedron 43, 959–970 (1987).

Kubisa et al., Polymer, 21, 1433 (1980).

Nakayama et al., Photodelamination Imaging–A New Approach in Dry Processing, J. Soc. Photog. Sci. Eng., 22(3), 138 (1978).

Pericas et al., Tetrahedron Letters, (1977), 4437–38.

Reichmanis et al., Chemical Amplification Mechanism for Microlithography, Chem. Mater., 3(3), 394 (1991).

Sabongi, G. J. Chemical Triggering—Reactions of Potential Utility in Industrial Processes, Plenum Press, New York, New York (1987), pp. 49–51, 68–72, 97–101 and 162–164.

Sprague et al., Phot. Sci. Eng., 5, 98 (1961).

Sprague et al., Phot. Sci. Eng., 8, 95 (1964).

Sprague et al., Phot. Sci. Eng., 9, 133 (1965).

Woodruff et al., Image Formation by Photoadhesion, Photog. Sci. Eng., 11 (3), 93 (1967).

PROCESSES AND COMPOSITIONS FOR PHOTOGENERATION OF ACID

REFERENCE TO PARENT APPLICATIONS

This application is a continuation-in-part of copending application Ser. No. 07/686,502, filed Apr. 17, 1991, to issue as U.S. Pat. No. 5,227,277 on Jul. 13, 1993. This copending application is assigned to the same assignee as the present application.

The aforementioned copending application describes an imaging process comprising:

providing a polymeric, depolymerizable layer comprising a depolymerizable polymer which at least partially depolymerizes in the presence of acid, the depolymerizable layer further comprising an infra-red dye capable of absorbing infra-red radiation in the range of about 800 to about 1200 nm and an acid generator capable of generating acid, the depolymerizable layer being substantially non-tacky prior to depolymerization of the polymer but becoming tacky upon at least partial depolymerization of the polymer; and providing a layer of an imaging material on the depolymerizable layer, the layer of the imaging material having a cohesive strength greater than the adhesive strength between the imaging material and the depolymerizable layer prior to depolymerization of the polymer, thereby providing an imaging medium;

imagewise exposing portions of the imaging medium to infra-red actinic radiation in the range of about 800 to about 1200 nm, thereby causing absorption of the infra-red radiation by the infra-red dye, generation of acid by the acid generator, and at least partial depolymerization of the polymer in the exposed areas of the depolymerizable layer, rendering these exposed areas tacky and firmly attaching exposed portions of the imaging material layer to the depolymerizable layer; and removing from the depolymerizable layer the portions of the imaging material in the unexposed areas, but leaving the portions of the imaging material in the exposed areas adhered to the depolymerizable layer, and thereby forming an image.

The acid generator used in this imaging process can be, inter alia, an iodonium salt, and the infra-red dye can be, for example, 1,3-bis[(2,6-di-t-butyl-4H-thiopyran-4-ylidene)methyl]-2,4-dihydroxy-dihydroxide-cyclobutene diylium-bis {inner salt}, the dye of formula:

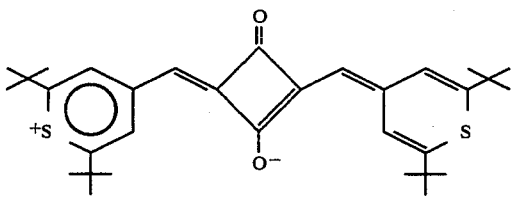

which is described in U.S. Pat. No. 4,508,811.

This application is also a continuation-in-part of copending application Ser. No. 07/965,161 (now U.S. Pat. No. 5,256,612), filed Oct. 23, 1992, which is also assigned to the same assignee as the present application.

This copending application Ser. No. 07/965,161 describes a process for generation of acid, which process comprises:

providing a medium containing a mixture of a superacid precursor and a dye capable of absorbing actinic radiation of a first wavelength which does not, in the absence of the dye, cause decomposition of the superacid precursor to form the corresponding superacid, the superacid precursor being capable of being decomposed by actinic radiation of a second wavelength shorter than the first wavelength;

irradiating the medium with actinic radiation of the first wavelength, thereby causing absorption of the actinic radiation, and decomposition of part of the superacid precursor, without formation of free superacid but with formation of a protonated product derived from the dye; and thereafter irradiating the medium with actinic radiation of the second wavelength, thereby causing decomposition of part of the remaining superacid precursor, with formation of free superacid.

The superacid precursor used in this process can be, inter alia, an iodonium salt, and the radiation absorber is preferably an infra-red dye having absorption in the range of 700–1200 nm, for example the dye of the formula given above. The medium may also contain a secondary acid generator capable of superacid-catalyzed decomposition to form a second acid, such that, in the part of the medium irradiated with the actinic radiation of the first wavelength, the superacid catalyzes the thermal decomposition of the secondary acid generator and the second acid is formed, whereas the part of the medium not irradiated with the actinic radiation of the first wavelength remains essentially free from the second acid.

The disclosures of the two aforementioned copending applications are herein incorporated by reference.

BACKGROUND OF THE INVENTION

This invention relates to processes and compositions for the generation of acid.

Many processes are known using a medium which, when irradiated with electromagnetic radiation, generates an acid. This acid is then used to cause a change in the properties of the medium, so that exposed and unexposed portions of the medium differ in their properties. For example, besides the processes described in the two aforementioned copending applications, many photoresist compositions are of this type; the acid produced upon exposure to (typically) ultra-violet radiation changes the solubility of the photoresist composition in the solution used to develop the photoresist.

In most prior art acid-generating photoresist processes, the sensitivity of the medium to the exposing radiation is not of major concern, since exposure is normally effected using powerful ultra-violet sources and long exposure times can be tolerated. However, the processes described in the two aforementioned applications are primarily intended for imaging with near infra-red radiation using radiation from semiconductor diode lasers; such diode lasers have the advantage of being much less expensive than ultra-violet lasers, while being well adapted for the production of high resolution images and for digital imaging processes (i.e., for producing hard copies of images stored on computers in digital form). The cost per unit intensity for a high-resolution addressable source is higher for ultra-violet radiation than for infra-red radiation. However, the imaging speed of such processes using infra-red radiation is presently limited by the sensitivity of the medium, and accordingly, there is a need to develop infra-red sensitive imaging media with improved sensitivity.

The sensitivity of such photosensitive compositions can be increased if the photosensitive molecule catalyzes a secondary reaction which is not radiation-dependent and effects conversion of several molecules for each quantum absorbed. For example, photoresist systems are known in which the primary photochemical reaction produces an acid, and this acid is employed to eliminate acid-labile groups in a secondary, radiation-independent reaction. See, for example, U.S. Pat. Nos. 3,932,514 and 3,915,706; Reichmanis et al., Chemical Amplification Mechanism for Microlithography, Chem. Mater., 3(3), 394 (1991) and Berry et al., Chemically Amplified Resists for I-line and G-line Applications, SPIE, 1262, 575 (1990). Also, U.S. Pat. No. 5,084,371 describes a radiation-sensitive mixture which contains a water-insoluble binder which comprises a mixture of phenolic and novolak polymers soluble or dispersible in aqueous alkali, and an organic compound whose solubility in alkaline developer is increased by acid, and which also contains at least one acid-cleavable group, and in addition a further group which produces a strong acid upon exposure to radiation. Similarly, in the aforementioned application Ser. No. 07/965,161, a secondary acid generator (when used) "amplifies" the acid produced by the iodonium salt or other superacid precursor, resulting in several molecules of acid being produced for each molecule of superacid originally produced by decomposition of the iodonium salt. However, despite the increase in sensitivity achieved by such acid amplification, the contrast, and hence the quality, of the resultant image is still governed by the original photochemical acid generation step. Accordingly, it is desirable to secure as high a quantum yield as possible during the photochemical acid generation step.

The present inventors have carried out extensive investigations regarding the factors which significantly affect the quantum yield of infra-red sensitive acid-generating reactions, and have determined that, when the acid precursor employed is a diaryl iodonium salt, certain squarylium dyes are effective in acid generation. The binder used in the imaging medium also has an important influence on the quantum yield.

SUMMARY OF THE INVENTION

Accordingly, this invention provides an acid-generating medium comprising:

a diaryl iodonium salt; and a squarylium dye capable of absorbing infra-red radiation having a wavelength within the range of about 700 to about 1200 nm, the dye having a squarylium ring the 1- and 3-positions of which are each connected, via a single $sp^2$ carbon atom, to a pyrylium, thiopyrylium, benzpyrylium or benzthiopyrylium moiety, at least one of the $sp^2$ carbon atoms having a hydrogen atom attached thereto, and the 2-position of the squarylium ring bearing an $O^-$, amino or substituted amino, or sulfonamido group.

This invention also provides a process for generating acid, which process comprises:

providing a mixture of a diaryl iodonium salt and a squarylium dye capable of absorbing infra-red radiation having a wavelength within the range of about 700 to about 1200 nm, the dye having a squarylium ring the 1- and 3-positions of which are each connected, via a single $sp^2$ carbon atom, to a pyrylium, thiopyrylium, benzpyrylium or benzthiopyrylium moiety, at least one of the $sp^2$ carbon atoms having a hydrogen atom attached thereto, and the 2-position of the squarylium ring bearing an $O^-$, amino or substituted amino, or sulfonamido group; and irradiating the mixture with infra-red radiation having a wavelength within the range of about 700 to about 1200 nm, thereby causing absorption of the radiation by the squarylium dye and formation of acid in the mixture.

Persons skilled in the art of organic chemistry are aware that compounds containing squarylium rings normally exist in the form of resonance hybrids. For example, the infra-red dyes used in the present invention in which the 2-position of the squarylium ring bears an $O^-$ group are normally represented by the formula:

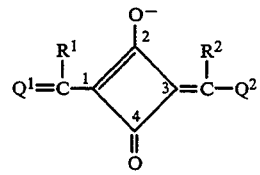

(in which at least one of $R^1$ and $R^2$ is a hydrogen atom, and the other may be a hydrogen atom or, for example, an alkyl group, and $Q^1$ and $Q^2$ are each a pyrylium, thiopyrylium, benzpyrylium or benzthiopyrylium moiety). In such dyes, the two oxygen atoms are in fact equivalent and the formula could equally well be written:

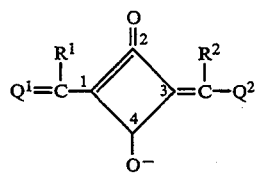

For convenience, herein the convention will be adopted that the 4-position of the squarylium ring carries an oxo ($O=$) group, while the 2-position carries the $O^-$, amino or sulfonamido group. The dyes in which the 2-position carries an $O^-$ group may hereinafter be called "unsubstituted squarylium dyes."

DETAILED DESCRIPTION OF THE INVENTION

Figure 1:
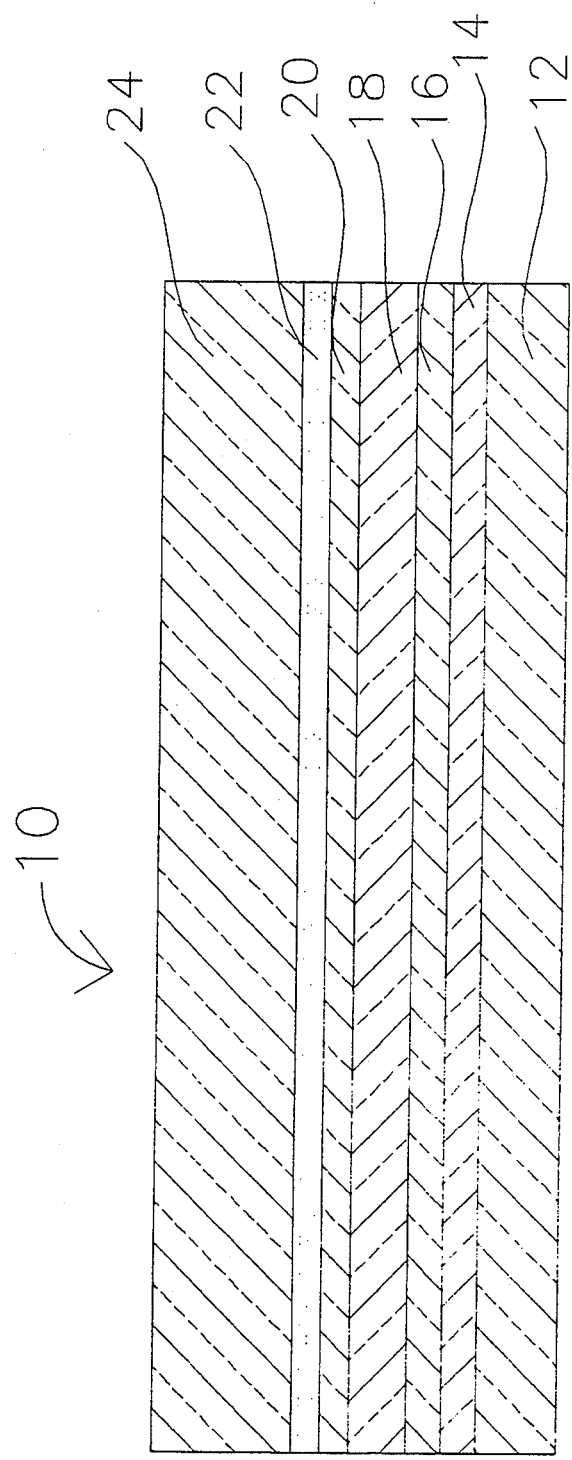
FIG. 1 of the accompanying drawings is a schematic section through a first imaging medium of the present invention, this medium being of the peel-apart type described in the aforementioned copending application Ser. No. 07/686,502.

As already mentioned, the present invention provides a process for generating acid using a mixture of a squarylium infra-red dye capable of absorbing infra-red radiation having a wavelength of about 700 to about 1200 nm, and an iodonium salt. This mixture is irradiated with infra-red radiation having a wavelength of about 700 to about 1200 nm, thus causing absorption of the radiation by the infra-red dye and formation of acid in the mixture. The squarylium dye used has a squarylium ring the 1- and 3-positions of which are each connected, via a single $sp^2$ carbon atom, to a pyrylium, thiopyrylium, benzpyrylium or benzthiopyrylium nucleus. Such dyes are herein called "pentamethine squarylium dyes," and the $sp^2$ carbon atoms between the squarylium ring and the aromatic systems may be called the "meso carbon atoms." At least one of these $sp^2$ carbon atoms must have a hydrogen atom attached thereto, since it has been found that dyes lacking such a meso hydrogen atom are not effective in acid generation. The 2-position of the squarylium ring bears an $O^-$, amino, substituted amino or sulfonamido substituent.

As is well known to those familiar with diaryl iodonium salts, such salts require the presence of an iodonium salt sensitizer, typically a polycyclic hydrocarbon such as pyrene, to enable the salt to break down upon exposure to ultra-violet radiation of longer wavelength than is absorbed by the iodonium salt itself, thereby producing superacid. Accordingly, where necessary, references herein to a diaryl iodonium salt shall be construed to refer to a mixture of such a salt and an ultra-violet absorbing iodonium salt sensitizer.

Any of the diaryl iodonium salts known to be useful in generating superacids may be used in the present process; see, for example, U.S. Pat. No. 5,102,771. Examples of suitable diaryl iodonium salts include diphenyl iodonium, dinaphthyl iodonium, di(4-chlorophenyl) iodonium, tolyl dodecylphenyl iodonium, naphthyl phenyl iodonium, 4-trifluoromethylphenyl phenyl iodonium, 4-ethylphenyl phenyl iodonium, di(4-acetylphenyl) iodonium, tolyl phenyl iodonium, anisyl phenyl iodonium, 4-butoxyphenyl phenyl iodonium, di(4-phenylphenyl) iodonium and di(carbomethoxyphenyl) iodonium salts. Especially preferred diaryl iodonium salts for use in the process are alkoxyphenyl phenyl iodonium salts, such as octyloxyphenyl phenyl iodonium hexafluoroantimonate, which gives very good generation of acid when used in the present process together with an infra-red dye. This iodonium salt has low toxicity and is soluble in the same types of semi-polar solvents, for example dichloromethane, as the infra-red dyes.

The immediate product of the present process is not the free superacid produced by decomposition of the iodonium salt under ultra-violet radiation using an ultra-violet sensitizer. As discussed in more detail below with reference to Table 1 and FIGS. 4A–4D of the accompanying drawings, the superacid derived from the iodonium salt is in effect buffered by the dye, with one of the decomposition products from the iodonium salt becoming bonded to the dye to produce a protonated species derived from the dye. This protonated species is a much weaker acid than the superacid which can be derived from the iodonium salt under ultra-violet irradiation, but is sufficiently acidic to carry out many useful processes. If a stronger acid is needed for a particular reaction, free superacid may be produced in the medium using the technique described in the aforementioned copending application Ser. No. 07/965,161; this technique is summarized below with reference to FIGS. 3 and 4.

The imaging medium of the present invention desirably comprises a binder, preferably a polymeric binder, which serves to bind the infra-red dye and the iodonium salt into a coherent layer which can be handled readily. The chemical nature of the binder has a major effect upon the quantum efficiency of the acid-generating process, although the exact relationship between binder chemistry and quantum efficiency is not at present entirely clear. The binder should be such that the infra-red dye and the iodonium salt can be dispersed therein without undue aggregation, which tends to adversely affect the quantum efficiency of the acid-generating process. The suitability of any specific combination of infra-red dye, iodonium salt and binder is readily decided by routine empirical tests, but polystyrene, poly($\alpha$-methylstyrene) and poly(vinyl chloride) are generally preferred as binders.

It has been found that pentamethine squarylium dyes used in the present process are substantially more effective as acid generators than the corresponding croconylium dyes, or dyes in which the two nuclei are connected via a conjugated chain of $sp^2$ carbon atoms, even if some carbon atoms in the chain are rigidized by being including in carbocyclic rings. The effectiveness of the infra-red dye in generating acid has been found to correlate with the oxidation potential and the excited state lifetime of the dye. Accordingly, it is preferred that the dye used in the present process have an oxidation potential in dichloromethane not greater than about 500 mV, and preferably not greater than about 400 mV, relative to a standard calomel electrode. Dyes having oxidation potentials greater than about 500 mV have been found not to be good acid generators, presumably because the high oxidation potential of the dye renders the free energy change ($\Delta G^0$) for reaction between the excited state of the dye and the iodonium salt, which is apparently responsible for acid generation, unfavorable. Also, preferably the dye has an excited state lifetime in the medium, but in the absence of the iodonium salt, of not less than about 200 picoseconds.

Dyes having unsubstituted squarylium rings are useful in the present process, as are dyes having a 2-sulfonamido substituent. Such 2-sulfonamido dyes are described in copending application Ser. No. 07/795,034, filed Nov. 20, 1991 (to issue as U.S. Pat. No. 5,227,498), copending application Ser. No. 07/979,250, filed Nov. 20, 1992, and the corresponding International Application PCT/US92/09992 (Publication No. WO 93/09956), and are conveniently synthesized by treating the corresponding squarylium dye with the appropriate organosulfonyl isocyanate, with elimination of carbon dioxide; for example tosyl isocyanate (p-$CH_3$—$C_6H_4$—$SO_2NCO$) converts a squarylium dye to the corresponding p-tolylsulfonamido squarylium dye. This reaction proceeds readily in solution in a non-polar solvent, for example toluene, no catalyst being required. The reaction is not confined to aromatic sulfonyl isocyanates and can be carried out with alkyl sulfonyl isocyanates, for example butylsulfonyl isocyanate. The 2-aminosquarylium dyes in which the amino group does not form part of a sulfonamido group, which are also described in the aforementioned applications Ser. Nos. 07/795,034 and 07/979,250 and International Application PCT/US92/09992, may also be used in the present process. However, if a 2-aminosquarylium dye is used, it is desirable that it be one in which at least one of the pyrylium, thiopyrylium, benzpyrylium or benzthiopyrylium moieties bears at least one electron-donating substituent. Unlike the unsubstituted squarylium dyes, which are usually non-ionic and exist as inner salts in which the positive charge on one pyrylium etc. moiety is balanced by the O⁻ group on the squarylium ring, 2-aminosquarylium dye are usually cationic, since the positive charge on one pyrylium etc. moiety is not balanced by any charge on the squarylium ring. A cationic dye tends to be less effective than a non-ionic dye in transferring an electron to the iodonium salt to bring about decomposition of this salt. Electron-donating substituents on one or both pyrylium etc. moieties may promote electron transfer from the dye to the iodonium salt. The 2-alkyl and 2-aryl squarylium dyes described in copending application Ser. No. 07/795,341, filed Nov. 20, 1991 (to issue as U.S. Pat. No. 5,227,499) and the aforementioned International Application PCT/US92/09992 are not good acid generators and are not recommended for use in the present process.

Pentamethine squarylium dyes may be symmetric or asymmetric, and asymmetric dyes are sometimes preferred in the present process since they are less prone to aggregation when present at high concentration in an imaging medium containing a polymeric binder. Asymmetry in the dye may be achieved by having one meso carbon atom which does not bear a hydrogen atom; for example, one meso carbon atom could be unsubstituted and the other substituted with an alkyl group. Alternatively, an asymmetric dye may have two pyrylium, thiopyrylium, benzpyrylium or benzthiopyrylium moieties differing either in the type of moiety itself or in its substituents.

The substituents on the pyrylium, thiopyrylium, benzpyrylium or benzthiopyrylium moieties significantly affect the performance of the dye. Pyrylium and thiopyrylium moieties desirably are substituted at the 2-position, and preferably also at the 6-position, with an alkyl, cycloalkyl or alkoxyphenyl group. Benzpyrylium and benzthiopyrylium moieties desirably are substituted at the 2-position with the same substituents. The acid-generating efficiency of infra-red dyes containing benzpyrylium and benzthiopyrylium moieties is also significantly affected by substitution at the 7-position of the moiety. Acid generation is promoted by the presence at this position of a morpholino group or a disubstituted amino group in which each of the substituents is an alkyl or cycloalkyl group, or the two substituents on the amino group together form a polymethylene chain which, together with the nitrogen atom of the amino group, forms a heterocyclic ring. Such 7-amino substituents also shift the wavelength of maximum infra-red absorption ($\lambda_{max}$) to longer wavelengths, which may be advantageous in some applications. An especially preferred 7-substituent is a disubstituted amino group in which the two substituents on the amino group are polymethylene chains, the ends of which remote from the nitrogen atom are connected to the 6- and 8-positions of the benzpyrylium or benzthiopyrylium nucleus. Preferably, the polymethylene groups are trimethylene groups, in which case the bis(trimethylene)amino substituent, together with the benzene ring to which it is attached, forms ajulolidine ring system; such compounds may hereinafter be called "julolidine" infra-red dyes. The presence of the julolidine group tends to reduce the solubility of the dye. Accordingly, to keep the dye sufficiently soluble, it is desirable that only one nucleus be of the julolidine type, or that substituents, such as highly-branched alkyl substituents, be provided on one or more position of the dye.

The present process may be used to initiate any of the acid-dependent reactions initiated by prior art acid-generating reactions which produce an acid of comparable strength. For example, the present process may be used to trigger an acid-catalyzed polymerization or depolymerization reaction. In particular, the present process may be used as part of the imaging process described in the aforementioned copending application Ser. No. 07/686,502. This process uses an imaging medium having a first layer containing the binder, infra-red dye and iodonium salt, the first layer also comprising a depolymerizable polymer which at least partially depolymerizes in the presence of acid. The medium also contains a layer of a porous or particulate imaging material superposed on the first layer, the layer of the imaging material having a cohesive strength greater than the adhesive strength between the imaging material and the first layer prior to depolymerization of the polymer, but less than the adhesive strength between the imaging material and the first layer after at least partial depolymerization of the polymer. This medium is imagewise exposed to infra-red radiation having a wavelength of about 700 to about 1200 nm; the radiation is absorbed by the infra-red dye, thus causing decomposition of the iodonium salt with generation of acid, and at least partial depolymerization of the polymer in the exposed areas of the first layer. This depolymerization renders the exposed areas tacky and firmly attaches exposed portions of the imaging material layer to the first layer. In a second step of the process, the portions of the imaging material in the unexposed areas are removed from the first layer, but the portions of the imaging material in the exposed areas adhere to the first layer are not removed, and thus an image is formed.

Figure 2:
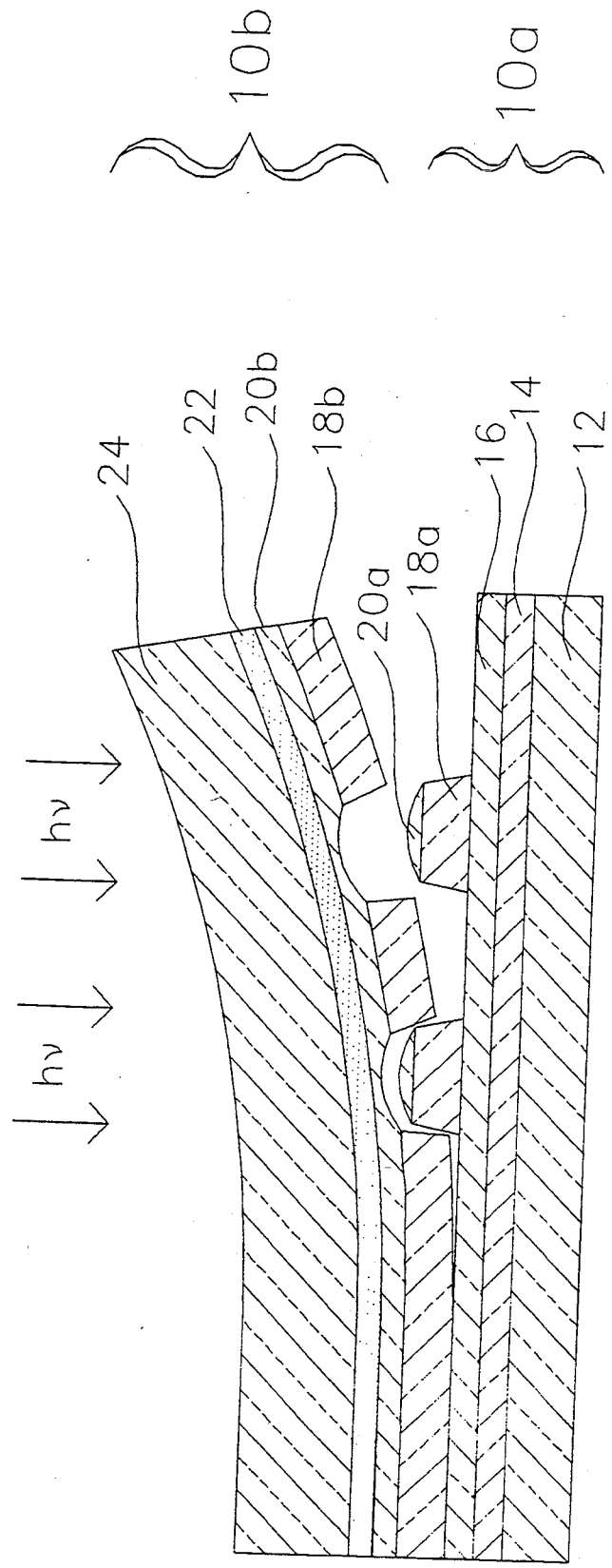
FIG. 2 shows a section, similar to that of FIG. 1, through the first imaging medium as its first and second elements are being separated to form a pair of complementary images.

In FIG. 1, there is shown a preferred laminar medium material 10 suited to production of a pair of images, shown as images 10a and 10b in a state of partial separation in FIG. 2. Imaging medium 10 includes a first sheet-like web material 12 having superposed thereon, and in order, stress-absorbing layer 14, depolymerizable layer 16, imaging layer 18, release layer 20, adhesive layer 22 and second sheet-like web material 24.

Upon exposure of imaging medium 10 to radiation, exposed portions of image-forming layer 18 are more firmly attached to sheet-like web material 12, so that, upon separation of the respective sheet-like web materials, as shown in FIG. 2, a pair of images, 10a and 10b, is provided.

Sheet-like web material 12 comprises a transparent material through which imaging medium 10 can be exposed to radiation. Web material 12 can comprise any of a variety of sheet-like materials, although polymeric sheet materials are preferred. Among preferred web materials are polystyrene, poly(ethylene terephthalate), polyethylene, polypropylene, poly(vinyl chloride), polycarbonate, poly(vinylidene chloride), cellulose acetate, cellulose acetate butyrate and copolymeric materials such as the copolymers of styrene, butadiene and acrylonitrile, including poly(styrene-co-acrylonitrile). An especially preferred web material from the standpoints of durability, dimensional stability and handling characteristics is poly(ethylene terephthalate), commercially available, for example, under the tradename Mylar, of E. I. DuPont de Nemours & Co., or under the tradename Kodel, of Eastman Kodak Company.

Stress-absorbing layer 14 reduces any tendency toward delamination of medium 10 at the weakest adhesive interface, i.e., at the interface between depolymerizable layer 16 and imaging layer 18. As shown in FIG. 2, in areas of exposure (between the pairs of arrows), imaging layer 18 is attached firmly to depolymerizable layer 16, so that in these areas of non-exposure, layer 18 is removed upon separation of sheets 12 and 24 after imaging. Where sheets 12 and 24 are separated before imaging, the result is an adhesive failure between layers 16 and 18. Such failure can also be caused unintentionally by applying stress or mechanical shock to medium 10. Delamination at the interface of layers 16 and 18, whether occurring during manufacturing operations, such as cutting or slitting operations, or during handling of the medium material in a printer or other imaging device, effectively destroys the imageability and usefulness of the imaging medium 10.

Layer 14 comprises a polymeric layer having the capacity to absorb compressive force or to undergo an elastic stretching. Typically, an imaging medium of this type will comprise a pair of sheets of differing thicknesses. The medium can, therefore, be readily flexed or bent, with creation of stresses in the medium which tend to cause delamination thereof. Layer 14 serves to absorb these stresses so as to minimize this undesirable tendency to delamination.

A variety of polymeric materials can be used to provide a stress-absorbing layer 14. In general, layer 14 will comprise a polymeric material having a soft and compressible or elongatable character. Useful polymers will also typically be thermoplastic, although a thermoplastic character will not be a prerequisite. Among preferred polymeric materials for layer 14 are the elastomeric polymers such as the elastomeric polyurethanes, examples of which are known in the art, and can be obtained from an aliphatic polyol, an aromatic diisocyanate and a chain-extending agent. Preferred and commercially available polyurethanes are the polyurethanes available as ICI XR-9619 and XR-9637 polyurethanes (from ICI Resins US, Wilmington, Mass.). Other polyurethanes can, however, be employed. Other preferred polymeric materials for layer 14 are the copolyesters of alkylene glycols (e.g., ethylene glycol and 1,4-butanediol) and aromatic terephthalic and isophthalic acids, commercially available, for example, as Bostik 7915 and 7975, from Bostik, Inc., Division of Total Chemie.

The depolymerizable polymer used in the medium shown in FIGS. 1 and 2 may be any polymer or mixture of polymers, alone or in admixture with low molecular weight materials, provided that this polymer or mixture is substantially non-tacky in its polymeric form, but develops sufficient tackiness and adhesion to the imaging layer upon at least partial acid-initiated depolymerization. Preferred polymers are polyaldehydes and polycarbonates. The polyaldehydes used may be homo- or copolymers of aliphatic or aromatic aldehydes, or copolymers of such aldehydes with other, non-aldehyde monomers, for example styrene. Such polyaldehydes are well known to those skilled in the art; see, for example, Vogl, Polymer, 21, 1433 (1980) and U.S. Pat. Nos. 3,915,706; 3,923,514 and 3,964,907. The polyaldehydes are conventionally prepared by ionic polymerization of the aldehyde in the cold and capping, typically with acetic anhydride. Precipitation of the polymer by standard methods gives polyaldehydes stable enough for long term storage and having a number average molecular weight generally in the range of 70,000 to 200,000. An especially preferred polyaldehyde for use in the present process is poly(o-phthalaldehyde). Appropriate polycarbonates are described in, for example, Fréchet, J. M. J. et al., J. Imaging Sci., 30(2), 59 (1986).

The depolymerizable layer 16 must, in its polymeric form, be substantially non-tacky, so that the adhesion of the imaging layer 18 to the depolymerizable layer 16 is less than the cohesivity of the imaging layer 18. Thus, as shown in FIG. 2, in the non-exposed regions, when the sheets 12 and 24 are separated, the imaging layer 18 is removed from the depolymerizable layer 16. However, upon exposure to radiation, the polymer in the layer 16 partially depolymerizes, thus rendering the layer 16 tacky and increasing the adhesion of the imaging layer thereto. Consequently, in the exposed regions, as shown in FIG. 2, when the sheets 12 and 24 are separated, the imaging layer 18 remains attached to the depolymerizable layer 16, but cohesive failure occurs within or on one surface of the release layer 20.

The exposing radiation may be applied from either side of the imaging medium 10. Where the imaging layer 18 is substantially transparent to the radiation, the radiation is preferably directed onto the depolymerizable layer 16 through the sheet 24 and the layers 22, 20 and 18, as shown in FIG. 2. Exposing in this direction ensures that maximum absorption of radiation occurs in the part of the depolymerizable layer 16 adjacent the imaging layer 18, where such absorption is most effective in causing the layer 18 to adhere to the layer 16. However, if the imaging layer 18 is made of a material (such as carbon black) which strongly absorbs the radiation, exposure may be made through the sheet 12 and the layer 14.

The depolymerizable layer 16 need only be thick enough to permit the imaging layer 18 to adhere thereto in the exposed areas. Consequently, the depolymerizable layer 16 can be made very thin, typically in the range of about 0.1 to about 5 μm. The use of a thin layer 16 is generally useful to ensure that proper depolymerization occurs at the interface between the depolymerizable layer 16 and the imaging layer 18 (this interface being, of course, the actual imaging surface of the medium 10), and permit optimal imaging and reduced radiation energy requirements. If, for example, the medium 10 is exposed through the sheet 12 and the depolymerizable layer 16 contains a strong absorber of the radiation, if the layer 16 is made too thick, most of the radiation may be absorbed in the part of the layer 16 adjacent the stress-absorbing layer 14, with only a small proportion of radiation reaching the part of the layer 16 adjacent the imaging layer 18. Under these circumstances, little depolymerization of the part of the layer 16 adjacent the layer 18 will occur, and the medium will exhibit low sensitivity. Obviously, this problem does not occur if exposure is made through the sheet 24.

Image-forming layer 18 comprises an image-forming substance deposited onto layer 16 as a porous or particulate layer or coming. Layer 18, called a colorant/binder layer, can be formed from a colorant material dispersed in a suitable binder, the colorant being a pigment or dye of any desired color, and if necessary substantially inert to any elevated temperatures generated during imaging of medium 10. Carbon black is a particularly advantageous and preferred pigment material. Preferably, the carbon black material will comprise particles having an average diameter of about 0.01 to 10 µm. Other optically dense substances, such as graphite, phthalocyanine pigments and other colored pigments can be used. If desired, substances which change their optical density upon subjection to elevated temperatures can also be employed.

The binder for the image-forming substance of layer 18 provides a matrix to form the porous or particulate substance thereof into a cohesive layer and serves to adhere layer 18 to layer 16. Layer 18 can be conveniently deposited onto layer 16 using any of several known coating methods. According to a preferred embodiment, and for ease in coating layer 18 onto layer 16, carbon black particles are initially suspended in an inert liquid vehicle (typically, water) and the resulting suspension or dispersion is uniformly spread over layer 16. On drying, layer 18 is adhered as a uniform image-forming layer onto the surface of layer 16. It will be appreciated that the spreading characteristics of the suspension can be improved by including a surfactant, such as ammonium perfluoroalkyl sulfonate, non-ionic ethoxylate or the like. Other substances, such as emulsifiers, can be used or added to improve the uniformity of distribution of the carbon black in its suspended state and, thereafter, in its spread and dry state. Layer 18 can vary in thickness and typically will have a thickness of about 0.1 to about 10 µm. In general, it will be preferred, for high image resolution, that a thin layer be employed. Layer 18 should, however, be of sufficient thickness to provide desired and predetermined optical density in the images prepared from imaging medium 10.

Suitable binder materials for image-forming layer 18 include gelatin, poly(vinyl alcohol), hydroxyethyl cellulose, gum arabic, methyl cellulose, polyvinylpyrrolidone, polyethyloxazoline, polystyrene latex and poly(styrene-co-maleic anhydride). The ratio of pigment (e.g., carbon black) to binder can be in the range of from 40:1 to about 1:2 on a weight basis. Preferably, the ratio of pigment to binder will be in the range of from about 4:1 to about 10:1. A preferred binder material for a carbon black pigment material is poly(vinyl alcohol).

If desired, additional additives or agents can be incorporated into imaging layer 18. Thus, submicroscopic particles, such as chitin, polytetrafluoroethylene particles and/or polyamide can be added to layer 18 to improve abrasion resistance. Such particles can be present, for example, in amounts of from about 1:2 to about 1:20, particles to layer solids, by weight.

As shown in FIG. 2, the relationships of adhesivity and cohesivity among the several layers of imaging medium 10 are such that separation occurs between layer 18 and depolymerizable layer 16 in non-exposed regions. Thus, imaging medium 10, if it were to be separated without exposure, would separate between layer 16 and layer 18 to provide a $D_{max}$ on sheet 24. The nature of layer 16 is such, however, that its relatively weak adhesion to layer 18 can be substantially increased upon exposure. Thus, as shown in FIG. 2, exposure of medium 10 to radiation in the direction of the arrows and in the areas defined by the respective pairs of arrows, serves in exposed areas to lock or attach layer 18, as portions 18a, to layer 16.

As shown in FIG. 2, exposed regions or portions of imaging layer 18 separate sharply from non-exposed regions. Layer 18 is an imagewise disruptible layer due to its porous or particulate nature and the capacity of the layer to fracture or break sharply at particle interfaces. For good image resolution or sharpness, it is essential that layer 18 be disruptible, such that a sharp separation can occur between exposed and unexposed regions of the imaged medium, through the thickness of the layer 18 and along a direction substantially orthogonal to the interface of the layers 18 and 16, i.e., substantially along the direction of the arrows in FIG. 2.

Shown in imaging medium 10 is a second sheet-like web material 24 covering image-forming layer 18 through adhesive layer 22 and release layer 20. Sheet 24 is laminated over image-forming layer 18 and serves as the means by which non-exposed areas of layer 18 can be carried from sheet 12 as image 10b, as shown in FIG. 2. Sheet 24 can comprise any of a variety of plastic, paper or other materials, depending upon the particular application for image 10b. Thus, a paper sheet material 24 can be used to provide a reflective image. Often, a transparency will be preferred, in which case, a transparent sheet 24 will be employed. A polyester (e.g., poly(ethylene terephthalate)) sheet material is a preferred material for this purpose.

In general, the thicknesses of the sheets 12 and 24 will depend upon the desired handling characteristics of medium 10 during manufacture, on imaging and post-imaging separation steps, and on the desired and intended use of the image to be carried on these sheets. For example, if the image is to be used in contact printing using divergent light (e.g., for the production of duplicate color separations in the graphics art industry), it may be necessary to limit the thickness of the sheet upon which the image is formed so that the resolution of the contact print is not adversely affected. The thicknesses may also be influenced by exposure conditions, such as the power of the exposing source of radiation. As already mentioned, when the sheets 12 and 24 are separated following exposure, a pair of complementary images is formed on the two sheets. Either or both images may be retained. However, in general one image (the "keeper") will be retained and the other image (the "throw-away") discarded. For technical reasons, in some applications it is desirable to use a "write white" imaging process, that is to say a process in which the exposed areas appear white in the final image. In the imaging medium 10, it is the image formed on the sheet 24 which is the "write white" image, and hence it is this image on the sheet 24 which is the keeper and normally retained and used. Thus, the sheet 24 should be thick enough to withstand normal handling in use. Typically, sheet 24 will vary in thickness from about 2 to 20 mil (51 to 510 µm). Good results can be obtained using a polymeric sheet 24 having a thickness of about 5 mil (127 µm) to about 10 mil (254 µm), although other thicknesses can be employed. The throw-away sheet 12, on the other hand, can be made thinner since it does not need to withstand extensive handling after exposure. Good results can be obtained using a polymeric sheet 12 having a thickness of about 0.75 mil (19 µm) to about 2 mil (51 µm) although other thicknesses can be employed.

Preferably, sheet 24 will be provided with a layer of adhesive to facilitate lamination. Adhesives of the pressure-sensitive, heat-activatable or radiation-activatable types can be used for this purpose. Typically, sheet 24 carrying adhesive layer 22 will be laminated onto sheet 12 using pressure (or heat and pressure) to provide a unitary laminate. Suitable adhesives include poly(ethylene-co-vinyl acetate), poly(vinyl acetate), poly(ethylene-co-ethyl acrylate), poly(ethylene-co-methacrylic acid) and polyesters of aliphatic or aromatic dicarboxylic acids (or their lower alkyl esters) with polyols such as ethylene glycol, and mixtures of such adhesives.

The properties of adhesive layer 22 can vary in softness or hardness to suit particular requirements of handling of the imaging medium during manufacture and use and image durability. A soft adhesive material of suitable thickness to provide the capability of absorbing stresses that may cause unwanted delamination can be used, as disclosed and claimed in U.S. Pat. No. 5,200,297. If desired, a hardenable adhesive layer can be used and cutting or other manufacturing operations can be performed before hardening of the layer, as described in the commonly assigned patent application of Neal F. Kelly, et al., entitled "Hardenable Adhesive for Thermal Imaging Medium," Ser. No. 07/616,853, filed Nov. 21, 1990 (now U.S. Pat. No. 5,342,731).

According to a preferred embodiment, and as shown in FIG. 1, release layer 20 is included in imaging medium 10 to facilitate separation of images 10a and 10b as shown in FIG. 2. As described above, regions of imaging layer 18 subjected to radiation become more firmly secured to layer 16 due to the depolymerization thereof. Non-exposed portions 18b of layer 18 remain only weakly adhered to layer 16 and are carried along with sheet 24 on separation of sheets 12 and 24. This is accomplished by the adhesion of layer 18 to layer 16, in non-exposed regions, being less than: (a) the adhesion between layers 18 and 20; (b) the adhesion between layers 20 and 22; (c) the adhesion between layer 22 and sheet 24; and (d) the cohesivity of layers 18, 20 and 22. The adhesion of sheet 24 to porous or particulate layer 18, while sufficient to remove non-exposed portions 18b of layer 18 from layer 16, is controlled, in exposed areas, by release layer 20 so as to prevent removal of firmly attached exposed portions 18a of layer 18.

Release layer 20 is designed such that its cohesivity or its adhesion to either adhesive layer 22 or porous or particulate layer 18 is less, in exposed areas, than the adhesion of layer 18 to layer 16. The result of these relationships is that release layer 20 undergoes an adhesive failure in exposed areas at the interface between layers 18 and 20, or at the interface between layers 20 and 22 or a cohesive failure of layer 20 occurs, such that portions are present in image 10b and portions are adhered in exposed regions to porous or particulate layer 18. Any portions of release layer 20 remaining with layer 18 may serve to provide some surface protection for the image areas of image 10a, against abrasion and wear.

Release layer 20 can comprise a wax, wax-like or resinous material. Microcrystalline waxes, for example, high-density polyethylene waxes available as aqueous dispersions, can be used for this purpose. Other suitable materials include carnauba, beeswax, paraffin wax and wax-like materials such as poly(vinyl stearate), poly-(ethylene sebacate), sucrose polyesters, poly(alkylene oxides) and dimethylglycol phthalate. Polymeric or resinous materials such as poly(methyl methacrylate) and copolymers of methyl methacrylate and monomers copolymerizable therewith can be employed. If desired, hydrophilic colloid materials, such as poly(vinyl alcohol), gelatin or hydroxyethyl cellulose can be included as polymer binding agents.

Resinous materials, typically coated as latices, can be used and latices of poly(methyl methacrylate) are especially useful. Cohesivity of layer 20 can be controlled so as to provide the desired and predetermined fracturing. Waxy or resinous layers, which are disruptible and can be fractured sharply at the interfaces of particles thereof, can be used to advantage. If desired, particulate materials can be added to the layer to reduce cohesivity. Examples of such particulate materials include silica, clay particles and particles of polytetrafluoroethylene.

Imaging medium 10 can be imaged by creating (in medium 10) a radiation pattern according to the information imaged. Exposure sources capable of providing radiation which can be imaged onto medium 10, and can be converted by absorption into a predetermined pattern, can be used. Lasers are examples of such sources.

The exposure of medium 10 to radiation can be progressive or intermittent. For example, a two-sheet laminar medium, as shown in FIG. 1, can be fastened onto a rotating drum for exposure of the medium through sheet 12. A light spot of high intensity, such as is emitted by a laser, can be used to expose the medium 10 in the direction of rotation of the drum, while the laser is moved slowly in a transverse direction across the web, thus tracing out a helical path. Laser drivers, designed to fire corresponding lasers, can be used to intermittently fire one or more lasers in a predetermined manner to record information according to an original to be imaged. As shown in FIG. 2, a pattern of intense radiation can be directed onto medium 10 by exposure to a laser in the direction of the arrows, the areas between the pairs of arrows defining regions of exposure.

It will be seen that the imaging medium shown in FIGS. 1 and 2 exhibits threshold-type behavior, in that, after exposure and peeling apart of the sheets 12 and 24, any particular area of the imaging layer is either wholly on the first sheet 12 or on the second sheet 24, depending upon the exposure which that area receives. This imaging medium is thus very suitable for applications, for example reproduction of half-tone prints, in which such threshold-type behavior is desirable.

If desired, the imaging medium shown in FIGS. 1 and 2 can be imaged using a moving slit or stencils or masks, and by using a tube or other source which emits radiation continuously and can be directed progressively or intermittently onto medium 10.

Preferably, a laser or combination of lasers will be used to scan the medium and record information as very fine dots or pels. Semiconductor diode lasers and YAG lasers having power outputs sufficient to stay within upper and lower exposure threshold values of medium 10 will be preferred. Useful lasers may have power outputs in the range of from about 40 milliwatts to about 1000 milliwatts. An exposure threshold value, as used herein, refers to a minimal power required to effect an exposure, while a maximum power output refers to a power level tolerable by the medium before "burn out" occurs. Lasers are particularly preferred as exposing sources inasmuch as medium 10 may be regarded as a threshold-type of film; i.e., it possesses high contrast and, if exposed beyond a certain threshold value, will yield maximum density, whereas no density will be recorded below the threshold value. Especially preferred are lasers which can provide a beam sufficiently fine to provide images having resolution as fine as 1,000 (e.g., 4,000 to 10,000) dots per centimeter.

The exposure time for the medium shown in FIGS. 1 and 2 may vary widely depending upon the source and exposure technique employed. Since the depolymerization effected by the exposure is a permanent, effectively irreversible chemical change in the depolymerizable layer, the extent of depolymerization is proportional to the amount of radiation absorbed and does not depend upon the rate at which this radiation is absorbed; this is in contrast to some thermal imaging media, in which imaging depends upon the development within the medium of some temperature above a threshold, in which case imaging is strongly dependent upon the rate at which the radiation is absorbed. Thus, with this imaging medium both the intensity of the radiation and the exposure time can vary over a wide range. When the imaging medium is exposed through a mask so that all parts of the image are illuminated at once, exposure times may typically vary from about 1 to about 60 seconds. However, when a focussed laser is used to expose the imaging medium one pixel at a time, typically the radiation will be applied for an extremely short period.

The present process may also form part of any of the imaging processes described in the aforementioned copending application Ser. No. 07/965,161. As already mentioned, the process described in this copending application uses a medium containing a mixture of a superacid precursor (preferably an iodonium salt) and a dye (preferably an infra-red dye) capable of absorbing radiation of a first wavelength (preferably infra-red radiation) which does not, in the absence of the dye, cause decomposition of the iodonium salt to form the corresponding superacid, the iodonium salt being capable of being decomposed (typically with the aid of an appropriate sensitizer, as mentioned above) by actinic radiation of a second wavelength (normally ultra-violet radiation) shorter than the first wavelength. This medium is irradiated imagewise with actinic radiation of the first wavelength, thereby causing absorption of the actinic radiation, and decomposition of part of the iodonium salt, without formation of free superacid but with formation of a protonated product derived from the dye. Thereafter, the entire medium is irradiated with actinic radiation of the second wavelength, thereby causing decomposition of part of the remaining iodonium salt, with formation of free superacid in the areas exposed to the radiation of the first wavelength.

The free superacid produced by this process may be used to carry out any of the reactions carried out using superacid generated by prior art processes. For example, the imaging medium may comprise a monomer or oligomer which polymerizes in the presence of the free superacid. If such a medium is imagewise exposed by this process, in the part of the medium exposed to the radiation of both the first and second wavelengths, the monomer or oligomer polymerizes, but in the part of the medium not exposed to the radiation of the first wavelength, the monomer remains substantially unpolymerized. Alternatively, the imaging medium may comprise a polymer which depolymerizes in the presence of the free superacid. When such a medium is imagewise exposed by this process, in the part of the medium exposed to the radiation of both the first and second wavelengths, the polymer depolymerizes, but in the part of the medium not exposed to the radiation of the first wavelength, the polymer is not significantly depolymerized. The imaging medium may also comprise a polymer the solubility of which in a solvent changes as a result of an acid-induced reaction. Following exposure of the medium to the radiation of both the first and second wavelengths, the medium is treated with the solvent. This solvent removes the polymer from one of the exposed and unexposed areas of the medium (i.e., the areas of the medium exposed and not exposed respectively to the radiation of the first wavelength), but not from the other of these areas. Thus, any of these types of imaging medium can act as a photoresist.

In a preferred form of the process described in the aforementioned copending application Ser. No. 07/965,161, the quantity of acid generated in the medium is increased ("amplified") by heating the medium, following the irradiation with the actinic radiation of the second wavelength, while the superacid is admixed with a secondary acid generator capable of superacid-catalyzed decomposition to form a second acid, the thermal decomposition of the acid generator being catalyzed by the presence of the superacid. When such an imaging medium is imagewise exposed to actinic radiation of the first wavelength, in the part of the medium irradiated with the actinic radiation of the first wavelength, the superacid catalyzes the decomposition of the secondary acid generator and the second acid is formed, whereas the part of the medium not irradiated with the actinic radiation of the first wavelength remains essentially free from the second acid.

Figure 3:
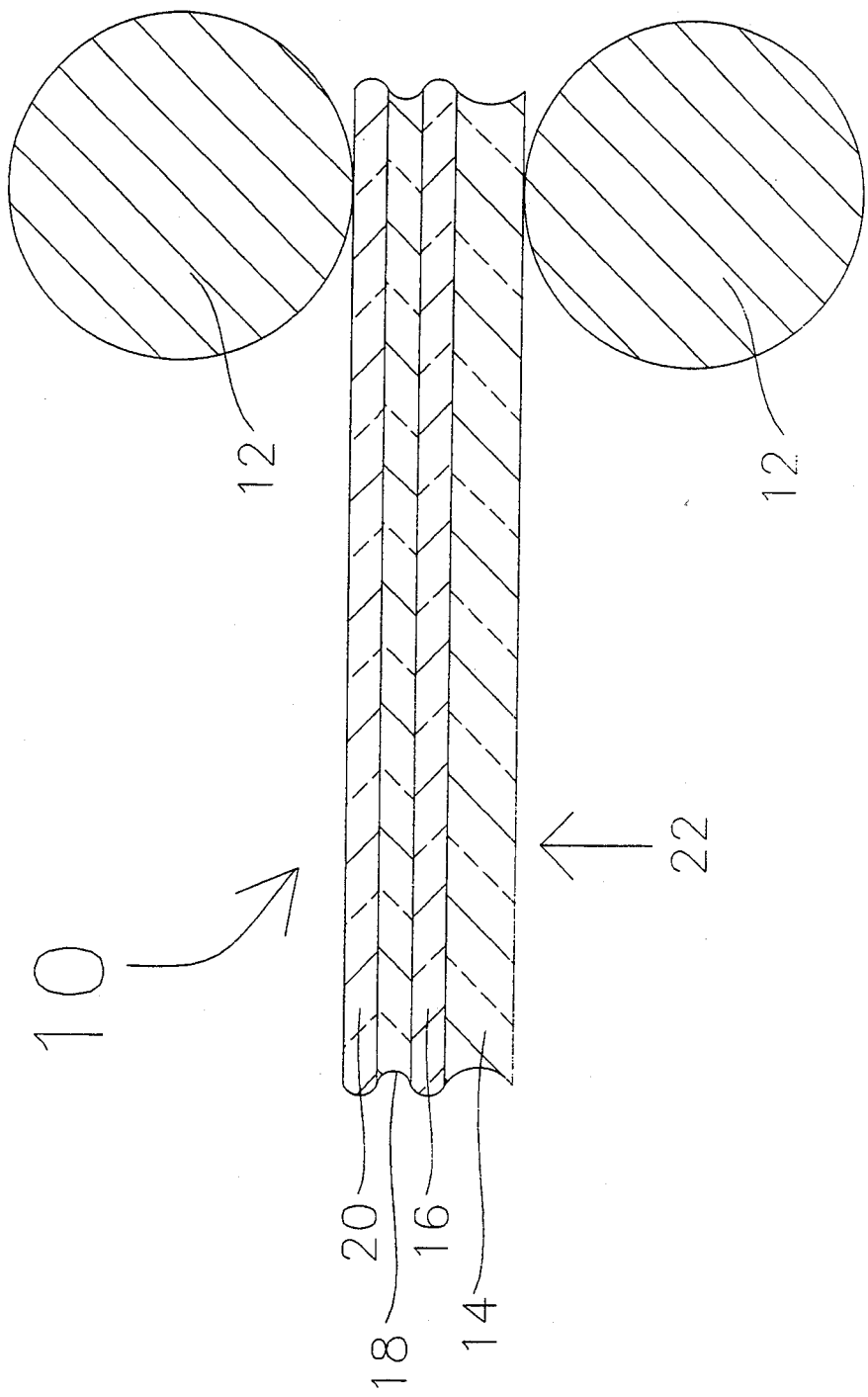
FIG. 3 is a schematic section through a second imaging medium of the present invention, this medium being of the type described in the aforementioned copending application Ser. No. 07/965,161, and shown as it is passed between a pair of hot rollers during the type of imaging process described in that copending application.

A preferred imaging medium of this "amplified" type is shown in FIG. 3 of the accompanying drawings, which shows a schematic cross-section through the imaging medium (generally designated 110) of the invention as the image therein is being fixed by being passed between a pair of hot rollers 112.

The imaging medium 110 comprises a support 114 formed from a plastic film. Typically the support 114 will comprise a poly(ethylene terephthalate) film 3 to 10 mils (76 to 254 mµ) in thickness, and its upper surface (in FIG. 3) may be treated with a sub-coat, such as are well known to those skilled in the preparation of imaging media, to improve adhesion of the other layers to the support.

On the support 114 is disposed an acid-generating layer 116 comprising an iodonium salt, an infra-red dye capable of carrying out the process of the present invention, and a secondary acid generator, which undergoes a superacid-catalyzed thermal decomposition to form a second acid. On the opposed side of the acid-generating layer 116 from the support 114 is disposed a color-forming layer 118 comprising an acid-sensitive material, which changes color in the presence of an acid, and a small amount of a base. The acid-generating layer 116 and the imaging layer 118 both contain a binder having a glass transition temperature substantially above room temperature.

Finally, the imaging medium comprises an abrasion-resistant topcoat 120.

The imaging medium 110 may be formed by coating the layers 116, 118 and 120 on to the support 114. Alternatively, for example, the layers 116 and 118 may be coated on to the support 114, and the topcoat 120 laminated on to the resultant structure.

The imaging medium 110 is exposed by writing on selected areas of the medium with an infra-red laser, this exposure being effected through the support 114, as indicated by the arrow 122 in the drawing (alternatively, exposure could be effected through the topcoat 20). Within the exposed regions of the acid-generating layer 116, the exposure to infra-red radiation causes breakdown of the iodonium salt with the formation of the corresponding superacid buffered by the infra-red dye, as described above. After this infra-red exposure, the imaging medium 110 is passed beneath a mercury lamp and given a blanket ultraviolet exposure sufficient to produce free superacid only in the infra-red exposed areas, and then passed between the heated rollers 112. The heat applied by the rollers 112 causes the free superacid present in the exposed regions of the acid-generating layer 116 to cause catalytic breakdown of the secondary acid generator therein, thus causing formation of a quantity of second acid substantially larger than the quantity of superacid originally generated by the ultra-violet radiation. The heat and pressure applied by the rollers 112 also raise the color-forming layer 118 and the acid-generating layer 116 above their glass transition temperatures. This causes the components dispersed in these two layers to become intermixed so that, in exposed regions, the second acid produced in the acid-generating layer 116 effects the color change of the acid-sensitive material, thus forming an image.

The imaging medium 110 shown in FIG. 3 will produce monochrome images. As will readily be apparent to those skilled in the imaging art, this imaging medium 110 may readily be modified to produce full color images by including two or more additional pairs of color-forming layers 118 and acid-generating layers 116. Acid-impermeable interlayers should be provided between each adjacent pair of layers, these interlayers having a glass transition temperature sufficiently high that it is not exceeded during passage of the medium between the rollers 112, so that the interlayers prevent mixing of adjacent pairs of layers 116 and 118. Typically, a multicolor medium will comprise three pairs of color-forming layers 118 and acid-generating layers 116 arranged to produce yellow, cyan and magenta images, as in conventional multicolor imaging media. The acid-generating layers 116 in such a medium will contain infra-red dyes absorbing at differing infra-red wavelengths so that the three color-forming layers can be imaged independently of one another using three infra-red lasers of differing wavelengths. It should be noted that only the infra-red dyes need differ among the plurality of acid-generating layers; conveniently, all the acid-generating layers can make use of the same iodonium salt and secondary acid generator.

The chemical changes which occur in exposed and unexposed regions of this medium are shown in Table 1 below, while the corresponding changes in acid concentration in exposed and unexposed areas are shown in FIGS. 4A–4D.

TABLE 1

| EXPOSED AREA | | UNEXPOSED AREA | |
|---|---|---|---|
| Component | Moles | Component | Moles |
| PRIOR TO EXPOSURE | | | |
| [DYE] | 1 | [DYE] | 1 |
| Secondary acid generator | 10 | Secondary acid generator | 10 |
| $Ph_2I^+PF_6^-$ | 5 | $Ph_2I^+PF_6^-$ | 5 |
| AFTER IMAGEWISE INFRA-RED EXPOSURE | | | |
| Ph-[DYE-H]$^+$PhIPF$_6^-$ | 0.75 | [DYE] | 1 |
| [DYE] | 0.25 | Secondary acid generator | 10 |
| Secondary acid generator | 10 | $Ph_2I^+PF_6^-$ | 4.25 |
| $Ph_2I^+PF_6^-$ | 3.5 | | |
| AFTER BLANKET ULTRA-VIOLET EXPOSURE | | | |
| Ph-[DYE-H]$^+$PhIPF$_6^-$ | 0.75 | [DYE] | 0.25 |
| [DYE-H]$^+$PF$_6^-$ | 0.25 | [DYE-H]$^+$PF$_6^-$ | 0.75 |
| HPF$_6$ | 0.5 | Secondary acid generator | 10 |
| Secondary acid generator | 10 | $Ph_2I^+PF_6^-$ | 4.25 |
| $Ph_2I^+PF_6^-$ | 3.5 | | |

TABLE 1-continued

| EXPOSED AREA | | UNEXPOSED AREA | |
|---|---|---|---|
| Component | Moles | Component | Moles |
| AFTER HEATING | | | |
| Ph-[DYE-H]$^+$PhIPF$_6^-$ | 0.75 | [DYE] | 0.25 |
| [DYE-H]$^+$PF$_6^-$ | 0.25 | [DYE-H]$^+$PF$_6^-$ | 0.75 |
| HPF$_6$ | 0.5 | Secondary acid generator | 10 |
| Second acid | 10 | $Ph_2I^+PF_6^-$ | 4.25 |
| $Ph_2I^+PF_6^-$ | 3.5 | | |
| AFTER BASE ADDITION | | | |
| Ph-[DYE-H]$^+$PhIPF$_6^-$ | 0.75 | [DYE] | 1 |
| [DYE-H]$^+$PF$_6^-$ | 0.25 | [BASE-H]$^+$PF$_6^-$ | 0.75 |
| [BASE-H]$^+$PF$_6^-$ | 0.5 | Secondary acid generator | 10 |
| Second acid | 9 | $Ph_2I^+PF_6^{-4.25}$ | |
| Base/second acid salt | 1 | | |
| $Ph_2I^+PF_6^-$ | 3.5 | | |

As shown in Table 1, before exposure both the exposed and unexposed regions comprise a quantity (shown in Table 1 as 1 mole for simplicity; all references to moles concerning Table 1 refer to moles per unit area of the imaging medium) of an infra-red dye, a larger molar quantity of an iodonium salt (5 moles of $Ph_2I^+PF_6^-$ are shown in Table 1; a suitable quantity of an ultra-violet absorbing iodonium salt sensitizer, such as pyrene, is also included in the medium but is not shown in Table 1) and a still larger molar quantity (10 moles are shown in Table 1) of a secondary acid generator.

The imaging medium is first imagewise irradiated with infra-red radiation of a frequency absorbed by the infra-red dye, the amount of radiation applied being sufficient to cause the infra-red dye to bring about decomposition of less than one mole (0.75 mole is used for illustration in Table 1 and FIG. 4) of the iodonium salt. In the area of the imaging medium exposed to the infra-red radiation (hereinafter called the "exposed area"), upon absorbing the infra-red radiation, the infra-red dye transfers an electron to the iodonium salt, which then fragments to produce a phenyl radical and phenyl iodide. Although the secondary reactions which follow this fragmentation of the iodonium salt are not entirely understood at present, one pathway for further reaction may be combination of a radical cation derived from the infra-red dye with the phenyl radical derived from the iodonium salt, and subsequent loss of a proton from the infra-red dye to form a protonated species derived from the infra-red dye and designated "Ph-[DYE-H]+" in Table 1, with charge balancing being effected by an anion derived from the iodonium salt. Each infra-red dye molecule transfers only a single electron, and hence generates a single proton, before being converted to the protonated species, and this protonated species does not carry out the electron transfer reaction. Hence, since each infra-red dye molecule causes breakdown of only a single molecule of iodonium salt before being deactivated, the infra-red dye will not cause decomposition of a greater molar quantity of the iodonium salt than the molar quantity of infra-red dye originally present, and the superacid generated is completely buffered by the dye. Thus, following the infra-red exposure, no free superacid is present in the exposed area. At this stage, the secondary acid generator in the exposed area remains unchanged. In the unexposed area, there is no change in any of the components of the imaging medium.

Figure 4A:
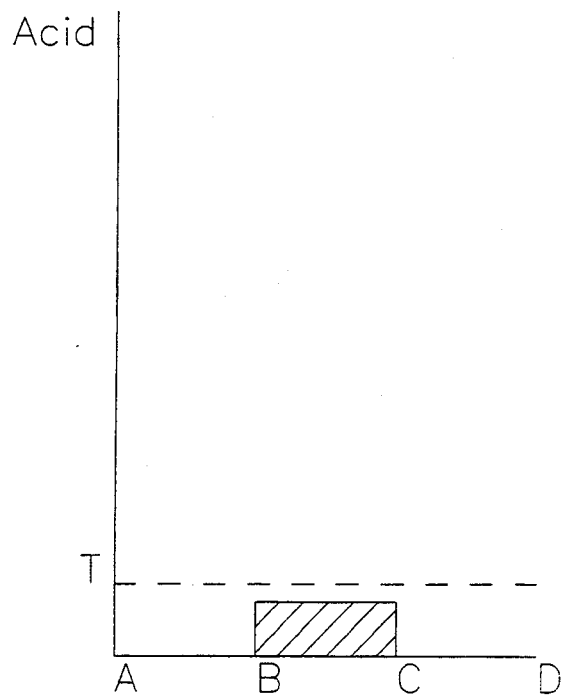
FIGS. 4A–4D show the acid concentrations in the exposed and unexposed regions of the imaging medium shown in FIG. 2 during the various steps of its imaging process.

The acid concentrations in the exposed and unexposed regions following this first step of the process are shown schematically in FIG. 4A, in which acid concentration is plotted along a line across the medium in which section BC is in an exposed area, while sections AB and CD are in unexposed areas. As shown in FIG. 4A, following the first step of the process, no acid is present in unexposed areas AB and CD, while the level of acid present in exposed area BC is below a threshold level T, which represents the level of acid which can be buffered by the infra-red dye; theoretically, the level of acid in area BC should be 0.75T. Hence, as already stated, all of the acid present in exposed area BC is buffered by the infra-red dye, and the imaging medium contains 0.75 mole of the Ph-[DYE-H]+ and no free superacid.

Figure 4B:
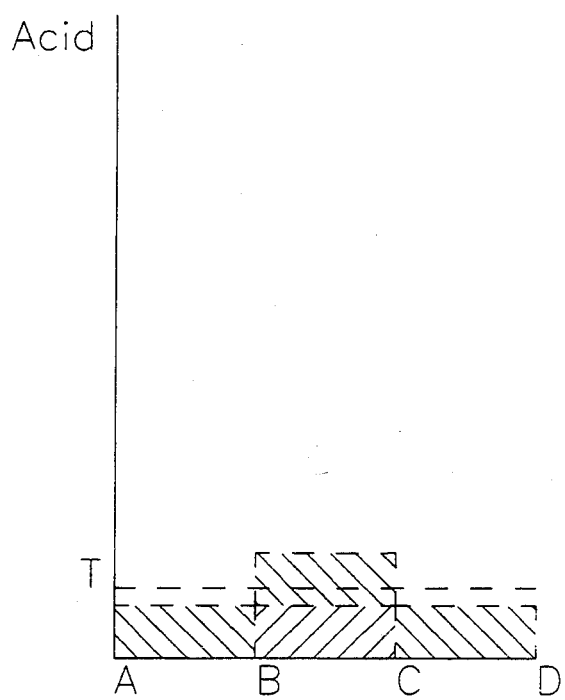

In the next stage of the imaging process, the whole of the imaging medium is irradiated with ultraviolet radiation effective to cause breakdown of the iodonium salt, with generation of superacid. The amount of ultraviolet radiation applied to the medium is chosen so as to produce a molar amount of superacid less than the molar amount of dye present in the unexposed medium, and in Table 1 is shown as sufficient to produce 0.75 mole of superacid. As illustrated in Table 1 and FIG. 4B, in the exposed area BC of the imaging medium (i.e., in the area exposed to the infra-red radiation), the additional 0.75 mole of superacid generated by the ultra-violet exposure, together with the 0.75 mole generated by the infra-red exposure, exceeds the threshold level T, and thus protonates all the infra-red dye present and leaves additional superacid in free form. (For purposes of illustration, FIG. 4B shows the acid generated in the infra-red and ultra-violet exposures separately, although of course no difference exists chemically.) In the unexposed areas AB and CD, on the other hand, only the 0.75 mole of superacid generated by the ultra-violet exposure is present, the acid concentration remains below the threshold level T, and all of the superacid produced is buffered by the infra-red dye, so that no free superacid is present following the ultra-violet irradiation. (As shown in Table 1, the buffered complex formed by the infra-red dye and the iodonium salt in the unexposed areas AB and CD during the ultraviolet irradiation differs from that produced in the exposed area BC during the infra-red irradiation. During the ultraviolet irradiation, the iodonium salt typically transfers a phenyl group not to the dye but rather to the iodonium salt sensitizer (which is effectively non-basic), so that only a proton comes to reside on the infra-red dye. However, this difference between the two buffered complexes does not affect the process, since both complexes efficiently buffer the superacid.)

Thus, at the end of the blanket ultraviolet irradiation, free superacid is present in the exposed area, whereas in the unexposed area no free superacid is present, all the superacid generated being buffered by the infra-red dye.

(In other variants of the present process using infra-red and ultra-violet exposures, only these two steps already described may be required. If, for example, the present process is to be used to bring about polymerization of a monomer or oligomer, or depolymerization of a polymer, as described above, the free superacid produced in area BC in FIG. 4B may be used directly to carry out the desired polymerization or depolymerization. It will be appreciated that, in such polymerization or depolymerization processes, the secondary acid generator can be omitted from the imaging medium.)

Figure 4C:
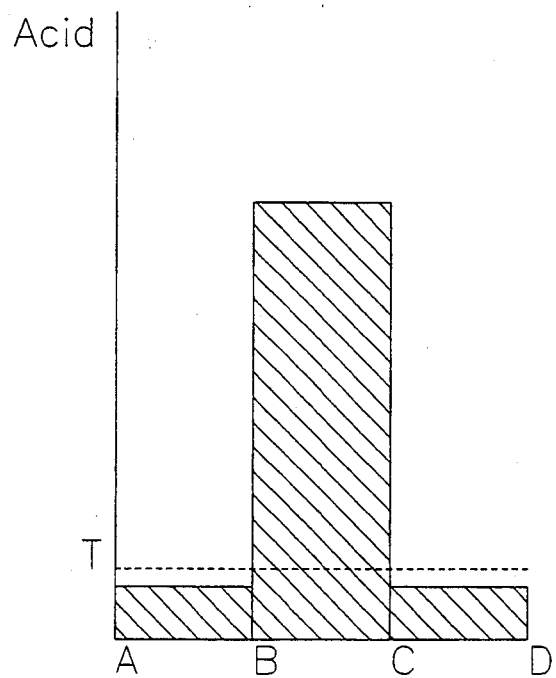

However, in a preferred process carried out according to FIG. 3, the imaging medium is next heated. In the exposed area BC, the free superacid present catalyzes the decomposition of the secondary acid generator, thus producing a large quantity of the second acid (10 moles are shown by way of example in Table 1; FIG. 4C is not strictly to scale). However, in the unexposed areas AB and CD, no free superacid is present, and the dye-superacid complex does not catalyze the decomposition of the secondary acid generator, so that essentially no decomposition of the secondary acid generator occurs and essentially no second acid is generated.

Figure 4D:
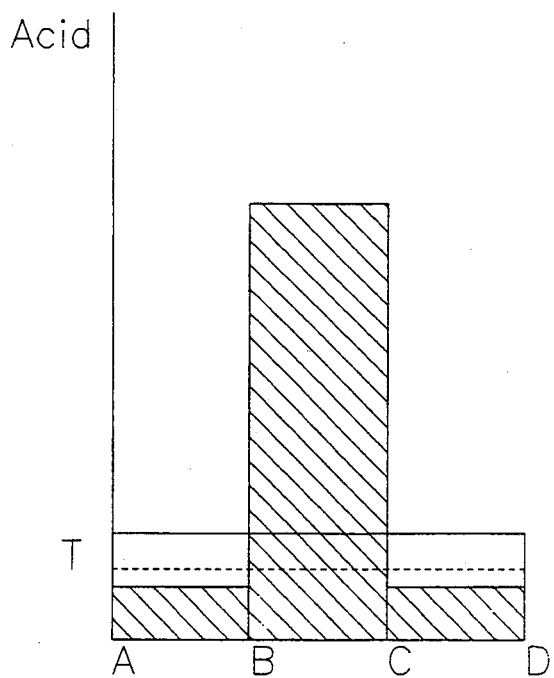

In the final step of the preferred process, as discussed in more detail below, a quantity of base is introduced into the imaging medium; 1.5 moles of base are shown in Table 1. The effect of this addition of base is to reduce acid levels throughout the imaging medium, as indicated in FIG. 4D. The addition of this base serves to ensure that, if a small amount of uncatalyzed thermal decomposition of the secondary acid generator does occur in unexposed areas AB and CD during the heating step, the small amount of second acid resulting will be neutralized by base before the second acid can effect changes in an acid-sensitive material, as described in more detail below. Although the addition of the base does reduce the amount of free acid present in the exposed area BC, this reduction is not significant since a more than adequate amount of second acid remains in the exposed area BC to affect an acid-sensitive material. The addition of base to the unexposed areas AB and CD leaves a surplus of base in these areas and thus serves to ensure that, if minor decomposition of the iodonium salt does occur after the present process has been completed, the minor amounts of superacid generated will be neutralized by the base and thus will not affect acid-sensitive material present in these unexposed areas.

From this description, it will be seen that, in the exposed area, the superacid catalyzes the breakdown of the secondary acid generator, so that the final quantity of second acid present is substantially larger than the quantity of superacid produced directly by the actinic radiation acting on the iodonium salt, although of course the second acid is typically a weaker acid than the superacid itself. This "chemical amplification" of the superacid by the secondary acid generator increases the number of moles of acid generated per einstein of radiation absorbed, and thus increases the contrast of the image produced by the present process as compared with simple generation of superacid by an iodonium salt. In practice, it has been found that, under proper conditions, at least 20 moles of second acid can be liberated for each mole of free superacid present in the exposed areas following the ultra-violet irradiation.

An advantage of this type of process is that it is often possible to compensate for any premature breakdown of the iodonium salt which may occur before use of the imaging medium, for example because of exposure of the imaging medium to ambient infra-red or ultra-violet radiation during transportation and storage or because the combination of the iodonium salt and the infra-red dye undergoes slow decomposition on protracted storage. With most infra-red dyes, the protonated products derived from the infra-red dye will absorb at a wavelength significantly different from that of the unprotonated infra-red dye, so that it will be possible to differentiate between the unprotonated dye and protonated product by measuring absorption at an appropriate infra-red wavelength. The amount of infra-red and ultra-violet irradiation can be adjusted to ensure that the present process works properly even if some decomposition of the iodonium salt takes place before use of the medium.

For example, to take an extreme case purely for purposes of illustration, suppose that the imaging medium shown in FIG. 3 and Table 1 is exposed to so much infra-red radiation, or undergoes sufficient thermal acid generation, during storage and transit that half the infra-red dye has already been converted to the Ph-[DYE-H]+ form before use. This breakdown of the infra-red dye causes a corresponding breakdown of 0.5 mole of iodonium salt, so that in all areas the medium initially contains 0.5 mole of infra-red dye, 10 moles of secondary acid generator, 4.5 moles of iodonium salt and 0.5 mole of Ph-[DYE-H]+. After infra-red analysis to determine the amount of Ph-[DYE-H]+, the infra-red irradiation may be adjusted so that, in exposed areas, only a further 0.4 mole of iodonium salt is decomposed by the dye. Thus, after the infra-red irradiation, the medium will contain 0.9 mole of the protonated product in exposed areas and 0.5 mole of the protonated product in unexposed areas.

If no change were made in the ultra-violet irradiation step described above with reference to Table 1, the results would be disastrous, since generation of a further 0.75 mole of acid in the unexposed areas would cause the acid concentration to exceed the threshold level, and the secondary acid generator would decompose in both the exposed and unexposed areas. Accordingly, based upon the results of the infra-red analysis, the ultra-violet irradiation is adjusted so that only (say) 0.4 mole of acid is decomposed in the exposed and unexposed areas. Accordingly, after the ultra-violet irradiation, 1.3 moles of acid (0.3 mole above threshold level) is present in the exposed areas and 0.9 mole (still below threshold level) in the unexposed areas. The slight reduction in the amount of free superacid in the exposed areas (0.3 mole, versus 0.5 mole in Table 1) will not significantly affect the results of the heating step, and the overall result of the imaging process will be unchanged.

For similar reasons, this type of process is also relatively insensitive to variations in infra-red radiation, such as those caused by variations in laser output, variations between individual lasers in a laser diode array used to form the imaging beam, timing errors in laser drivers, etc. For example, in the process shown in Table 1, the infra-red irradiation causes decomposition of 0.75 mole of iodonium salt. If the infra-red radiation delivered to the imaging medium varies by ±20%, some exposed areas will experience decomposition of 0.6 mole of iodonium salt, while others will experience decomposition of 0.9 mole. After ultra-violet irradiation, the concentration of free superacid in the exposed areas will vary from 0.15 to 0.6 moles. In practice, with appropriate control of the heating step, this range of variation in free superacid concentration will have minimal effects on the final, binary image.

Any secondary acid generator, capable of superacid-catalyzed breakdown to give a second acid, may be used in this process. Preferred secondary acid generators are squaric acid derivatives capable of generating squaric acid or an acidic derivative thereof, since squaric acid and its acidic derivatives are strong acids well suited to effecting color changes or other effects (for example, polymerization or depolymerization reactions) in acid-sensitive materials. Especially preferred squaric acid derivatives are those in which there is bonded to the squaric acid ring, via an oxygen atom, an alkyl or alkylene group, a partially hydrogenated aryl or arylene group, or an aralkyl group. The acid-catalyzed decomposition of these squaric acid derivatives causes replacement of the original alkoxy, alkyleneoxy, aryloxy, aryleneoxy or aralkoxy group of the derivative with a hydroxyl group, thus producing squaric acid or an acidic squaric acid derivative having one hydroxyl group.

The exact mechanism by which squaric acid or an acidic derivative thereof is formed in the present process may vary depending upon the type of squaric acid derivative employed. In some cases, for example di-t-butyl squarate, one or both groups attached via oxygen atoms to the squaric acid ring may thermally decompose to yield an alkene or arene, thus converting an alkoxy or aryloxy group to a hydroxyl group and forming the squaric acid or acidic derivative thereof. In other cases, for example 3-amino-4-(p-vinylbenzyloxy)-cyclobut-3-ene-1,2-dione, there is no obvious mechanism for formation of a corresponding alkene or arene, and it appears that the mechanism of acid formation is migration of the vinylbenzyl or similar group to a different position within the molecule (probably to the amino group), and protonation of the remaining oxygen atom to form a hydroxyl group at the position from which the group migrates. In other cases, neither of these pathways is possible. However, in all cases the net effect is the replacement of the alkoxy, alkyleneoxy, aryloxy, aryleneoxy or aralkoxy group present in the original derivative with a hydroxyl group to form squaric acid or an acidic derivative thereof.

There are four preferred groups of squaric acid derivatives for use in the amplified process:

(a) those of the formula:

in which $R^1$ is an alkyl group, a partially hydrogenated aromatic group, or an aralkyl group, and $R^2$ is a hydrogen atom or an alkyl, cycloalkyl, aralkyl, aryl, amino, alkylamino, dialkylamino, alkylthio, alkylseleno, dialkylphosphino, dialkylphosphoxy or trialkylsilyl group, subject to the proviso that either or both of the groups $R^1$ and $R^2$ may be attached to a polymer. Among the derivatives of Formula I, especially preferred groups are those in which (a) $R^1$ is an unsubstituted or phenyl substituted alkyl group containing a total of not more than about 20 carbon atoms in which the carbon atom directly bonded to the oxygen atom has not more than one hydrogen atom attached thereto, and $R^1$ is an alkyl group containing not more than about 20 carbon atoms, or a phenyl group (which may be substituted or unsubstituted); and (b) $R^1$ is a benzyloxy group and $R^2$ is an amino group.

(b) those of the formula:

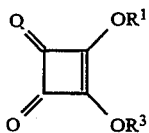

(II)

in which R¹ and R³ independently are each an alkyl group, a partially hydrogenated aryl group or an aralkyl group, subject to the proviso that either or both of the groups R¹ and R³ may be attached to a polymer. Among the derivatives of Formula II, an especially preferred group are those in which R¹ and R³ are each independently an unsubstituted or phenyl substituted alkyl group containing a total of not more than about 20 carbon atoms in which the carbon atom directly bonded to the oxygen atom has not more than one hydrogen atom attached thereto. Specific preferred compounds of Formula II are those in which R¹ and R³ are each a tertiary butyl group, an α-methylbenzyl group or a cyclohexyl group, namely di-tertiary butyl squarate, bis(α-methylbenzyl) squarate and dicyclohexyl squarate.

(c) those of the formula:

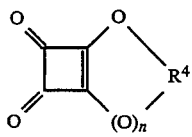

(III)

in which n is 0 or 1, and R⁴ is an alkylene group or a partially hydrogenated arylene group. Among the derivatives of Formula III, an especially preferred group is those in which n is 1 and R⁴ is an alkylene group containing not more than about 12 carbon atoms, in which each of the carbon atoms directly bonded to the oxygen atoms has not more than one hydrogen atom attached thereto.

(d) those having at least one unit of the formula:

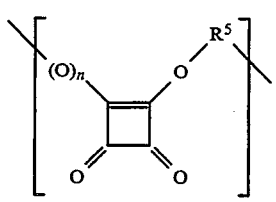

(IV)

in which n is 0 or 1, R⁵ is an alkylene or partially hydrogenated arylene group. In addition to the fragmentable groups R⁵, the compounds may also contain one or more units in which a non-fragmentable group is attached to a squarate ring, directly or via an oxygen atom.

The squaric acid derivatives of Formula IV include not only high polymers, but also dimers, trimers, tetramers, etc. including at least one of the specified units. The terminating groups on the derivatives of Formula IV may be any of groups OR¹ or R² discussed above with reference to Formula I. Thus, for example, Formula IV includes the squaric acid dimer derivative of the formula:

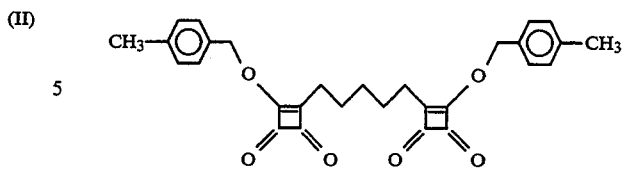

The squaric acid derivatives of Formulae I and II are usually monomeric. However, these derivatives of Formulae I and II can be incorporated into polymers by having at least one of the groups R¹, R² and R³ attached to a polymer. Attachment of the squaric acid derivatives to a polymer in this manner may be advantageous in that it may avoid incompatibility and/or phase separation which might occur between a monomeric squaric acid derivative of Formula I or II and a polymeric binder needed in an imaging medium.

The attachment of the groups R¹, R² and R³ to a polymer may be effected in various ways, which will be familiar to those skilled in the art of polymer synthesis. The squaric acid derivatives may be incorporated into the backbone of a polymer; for example, the groups may contain unsaturated linkages which enable the squaric acid derivatives to be polymerized either alone or in admixture with other unsaturated monomers. Alternatively, the squaric acid derivatives may be added as sidechains to a polymer; for example, one of the groups R¹, R² and R³ could contain an amino group able to react with a polymer containing a carboxyl group or derivatives thereof to form an amide linkage which would link the squaric acid derivative as a sidechain on to the polymer.

The preferred squaric acid derivatives of Formulae I–IV above are diesters of squaric acid or esters of monohydroxy derivatives of squaric acid, for example 4-alkyl-3-hydroxycyclobut-3-ene-1,2-diones. Like most esters, these preferred squaric acid derivatives are susceptible to hydrolysis, including acid-catalyzed hydrolysis, in the presence of water. However, the superacid-catalyzed decomposition of these derivatives used in preferred variants of the present process is not a hydrolysis, as shown by the fact that the decomposition is normally carried out in a polymeric medium which is free from water. Indeed, the presence of water is disadvantageous in the superacid-catalyzed decomposition, since the strongest acid species which can exist in the presence of water is the hydroxonium ion, $[H_3O]^+$, whereas in non-aqueous media the powerful superacids liberated by decomposition of diaryl iodonium salts produce much stronger acidic species. Accordingly, the process of the invention is preferably carried out in an environment which is essentially free from water.

In the present process, it is generally undesirable to form substantial quantities of gas during the superacid-catalyzed decomposition of the squaric acid derivative since such gas may distort the medium containing the squaric acid derivative or form vesicles therein, and such distortion or vesicle formation may interfere with proper image formation. Accordingly, if the decomposition of the squaric acid derivative yields an alkene, it is desirable that the groups R¹, R³, R⁴ and R⁵ be chosen so that this alkene is a liquid at 20° C., and preferably higher, since some heating of the alkane will inevitably occur during the superacid-catalyzed decomposition. Sometimes, however, the alkane liberated may be sufficiently soluble in the medium containing the squaric acid derivative that liberation of a highly volatile alkane will not result in distortion of, or vesicle formation in, the medium.

The preferred squaric acid derivatives described above may be prepared by known methods; for a fuller description of the methods of preparing these derivatives, see copending application Ser. No. 07/965,172 (now U.S. Pat. No. 5,278,081), filed Oct. 23, 1992 and assigned to the same assignee as the present application.

The amplified process of the present invention may be used for various purposes, such as triggering of an acid-catalyzed chemical reaction (for example, polymerization or depolymerization reactions). When the amplified process is used for image formation, simultaneously with or following the heating step, the second acid is contacted with an acid-sensitive material which changes color in the presence of the second acid. (It will be appreciated that the "color change" involved in such an imaging process need not be a visible color change. If, for example, the present process is used to provide security markings intended to be machine-readable, the "color change" could be a change in absorption from one non-visible wavelength to another, such that it can be detected by the appropriate machine-reading device.)

The acid-sensitive material used may be any material which undergoes a color change in the presence of the second acid. Thus any conventional indicator dye may be used as the acid-sensitive material, as may the leuco dyes disclosed in U.S. Pat. Nos. 4,602,263; 4,720,449 and 4,826,976, which are also sensitive to acid.

The exposure of the medium to the infra-red radiation of the first wavelength can be effected in any of the ways conventionally used for exposing media to the same type of radiation. Often, it is convenient to employ a laser of the appropriate wavelength, since the use of a laser is a convenient way to record data as an image pattern in response to transmitted signals, such as digitized information.

Some imaging media of the present invention (for example those intended for use as photoresists and containing polymerizable monomers or oligomers or depolymerizable polymers) may comprise only a single layer containing all the components of the imaging medium. However, media containing a secondary acid generator and an acid-sensitive material (such as the medium described above with reference to FIG. 3) desirably comprise two separate layers or phases. In such media, before the heating, the acid-sensitive material is present in a layer or phase separate from the layer or phase containing the iodonium salt, the infra-red dye and the secondary acid generator. After generation of the second acid from the secondary acid generator, the two layers or phases are mixed, thus effecting the color or other change in the acid-sensitive material.

In principle, the mixing of the acid-sensitive material, the iodonium salt, infra-red dye and secondary acid generator should be effected after the generation of the second acid from the secondary acid generator. However, in practice if the iodonium salt, infra-red dye and secondary acid generator are present in one layer of a two-layer imaging medium, and the acid-sensitive material in the other layer of the medium, these two layers being such that they mix on heating, both the generation of the second acid and the mixing of the two layers may be effected in a single heating step, since the superacid-catalyzed decomposition of the secondary acid generator will typically be essentially complete before mixing of the two layers becomes significant.

When a two-layer structure is used, it is not necessary that the two layers be affixed to one another before imaging. The production of unbuffered superacid and second acid in exposed regions effected by the present processes is a "permanent" chemical change, and hence it is possible to delay contacting the exposed medium with an acid-sensitive material for a substantial time. (Obviously, excessive delay may reduce the quality of an image produced by allowing superacid or second acid to diffuse from exposed into unexposed areas of the medium.) Accordingly, the two layers of the imaging medium may be laminated together after the second irradiation. However, in general it is most convenient to form the two layers by coating one on the other, or laminating the two layers together before imaging, since in this way only a single sheet of material has to be handled during the imaging process. Since it is important that the two layers not mix prematurely, if the two layers are to be coated successively on to a support, it is usually desirable to coat one layer from an aqueous medium and the other from a non-aqueous medium. Typically, the layer containing the iodonium salt is coated from an organic solution and the layer containing an acid-sensitive leuco dye or other material is coated from an aqueous dispersion.

As already mentioned with reference to FIG. 3 and Table 1, before the heating step, the acid-sensitive material may be in admixture with an amount of a basic material insufficient to neutralize all the second acid liberated by the secondary acid generator during the heating. When such a base-containing medium is heated, the second acid liberated by the secondary acid generator during the heating neutralizes all of the basic material and leaves excess second acid sufficient to effect the change in the acid-sensitive material. The provision of this basic material serves to "soak up" minor amounts of acid which may be generated in unexposed areas after exposure due, for example, to slow decomposition of the iodonium salt/infra-red dye mixture during protracted storage. Obviously the basic material cannot be allowed to contact the superacid present after the second irradiation but before the heating step. Accordingly, desirably the basic material is present in a layer or phase separate from the layer or phase containing the iodonium salt and the secondary acid generator. After the generation of the second acid, the two layers or phases are mixed, thus effecting the change in the acid-sensitive material.

Besides the two aforementioned layers or phases containing the iodonium salt, infra-red dye, secondary acid generator and acid-sensitive material, the imaging media of the present invention may comprise a support and additional layers, for example, a subbing layer to improve adhesion to the support, acid-impermeable interlayers for separating multiple imaging layers from one another, an anti-abrasive topcoat layer, and other auxiliary layers.

The support employed may be transparent or opaque and may be any material that retains its dimensional stability at the temperature used for image formation. Suitable supports include paper, paper coated with a resin or pigment, such as, calcium carbonate or calcined clay, synthetic papers or plastic films, such o as polyethylene, polypropylene, polycarbonate, cellulose acetate and polystyrene. The preferred material for the support is a polyester, desirably poly(ethylene terephthalate).

Usually the layers containing the iodonium salt, infra-red dye, secondary acid generator and acid-sensitive material will also contain a binder; typically these layers are formed by combining the active materials and the binder in a common solvent, applying a layer of the coating composition to the support and then drying. Rather than a solution coating, the layer may be applied as a dispersion or an emulsion. The coating composition also may contain dispersing agents, plasticizers, defoaming agents, coating aids and materials such as waxes to prevent sticking.

The binder used for the layer(s) in which superacid is to be generated must of course be non-basic, such that the superacid is not buffered by the binder. Examples of binders that may be used include, but are not limited to, polymers of styrene and its derivatives (for example poly($\alpha$-methylstyrene)), methyl methacrylate and vinyl chloride. It will be appreciated that the binder selected should not have any adverse effect on the iodonium salt, dye, secondary acid generator or the acid-sensitive material incorporated therein. Also, the binder should be heat-stable at the temperatures encountered during the heating step and should be transparent so that it does not interfere with viewing of the image. The binder must of course transmit the actinic radiation used in the exposure steps.

The following Examples are now given, though by way of illustration only, to show details of preferred reagents, conditions and techniques used in the process and imaging medium of the present invention.

EXAMPLE 1

Polymerization Process of the Invention

This Example illustrates a process of the present invention in which superacid generated by successive infra-red and ultra-violet irradiation is used to cause polymerization of a difunctional epoxy monomer.

A coating fluid was prepared by dissolving a silicone diepoxy monomer of the formula:

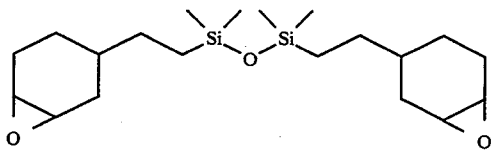

(supplied by General Electric Company, 40 mg), t-butyl-anthracene (5 mg; an iodonium salt sensitizer), 1,3-bis[[2,6-di-t-butyl-4H-thiopyran-4-ylidene)methyl]-2,4-dihydroxy-dihydroxide-cyclobutene diylium-bis{inner salt} (0.3 mg; see the aforementioned U.S. Pat. No. 4,508,811), (4-octyloxyphenyl)phenyliodonium hexafluoroantimonate (8 mg, prepared as per U.S. Pat. No. 4,992,571), and poly(vinyl chloride) (supplied by Aldrich Chemical Company, Milwaukee, Wisc. 30 mg) in methyl ethyl ketone (MEK, 0.6 mL). This solution was coated on to a poly(ethylene terephthalate) base 4 mil (101 $\mu$m) in thickness (ICI Type 3295, supplied by ICI Americas, Inc., Wilmington, Del.) using a number 18 coating rod.

The coated side of the resultant coating was exposed to infra-red radiation from a GaAlAs semiconductor diode laser emitting at 822 nm, which delivered 125 mW to the medium. The laser output was focussed to a spot approximately 33×3 $\mu$m. The medium was wrapped around a drum whose axis was perpendicular to the incident laser beam. Rotation of the drum about its axis and simultaneous translation in the direction of the axis caused the laser spot to write a helical pattern on the medium. The pitch of the helix was 33 $\mu$m, chosen so that none of the medium was left unexposed between adjacent turns. In this arrangement, the exposure received by the medium was inversely proportional to the speed of rotation of the drum (here measured as a linear speed at the medium surface). Separate bands of the medium were exposed at 2.0, 2.5, 3.0, 3.5 and 4.0 m/s. Following this infra-red exposure, the entire coating was exposed for 70 seconds to ultra-violet radiation from a Universal UV unit (nominally emitting at 375 nm) supplied by Gelman Instrument Company. The coating was next heated on a hotplate at 100° C. for 20 seconds, after which the coating was developed by washing sequentially with methyl ethyl ketone and dichloromethane. Residual material was finally removed by sonication in a bath of methyl ethyl ketone for three minutes. In all areas which had received the infra-red exposure, insoluble polymeric material remained adhering to the polyester base and was not removed by the solvent treatment or sonication, whereas in all other areas of the film, including those areas which had received ultra-violet but not infra-red irradiation, no polymeric material was left adhering to the base after these treatments.

EXAMPLE 2

Imaging Process of the Invention Using a Secondary Acid Generator

This Example illustrates an imaging process of the invention in which the imaging medium, which is of the type shown in FIG. 3, contains a secondary acid generator which amplifies the free superacid present in infra-red exposed areas following the infra-red and ultra-violet irradiations.

Two coating fluids were prepared as follows:

Fluid A: t-Butyl-anthracene (7 mg), the infra-red dye described in Example 1 above (0.3 mg), (4-octyloxyphenyl)phenyliodonium hexafluoroantimonate (5 mg), 3,4-bis(4-methylbenzyloxy)cyclobut-3-ene-1,2-dione (20 mg) and a copolymer of vinylidene chloride and acrylonitrile (Saran Resin F120, available from Aldrich Chemical Company, Milwaukee, Wisc., 30 mg) were dissolved in methyl ethyl ketone (0.6 mL).

Fluid B: A leuco dye of the formula:

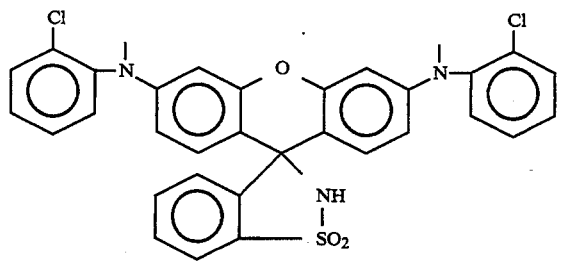

(15 mg; this leuco dye may be prepared by the procedure described in U.S. Pat. No. 4,345,017) and a hindered amine base (HALS-62, available from Fairmount Chemical Company, Inc., 117 Blanchard Street, Newark N.J. 07105, 7 mg) were dissolved in 1:1 MEK:-chloroform. Saran Resin F120 (available from Aldrich Chemical Company, Milwaukee, Wisc., 30 mg) dissolved in methyl ethyl ketone (0.3 mL) was added to the resultant solution.

These coating fluids were separately coated on to poly(ethylene terephthalate) base of 4 mil (101 μm) in thickness (ICI Type 3295, supplied by ICI Americas, Inc., Wilmington Del.) using a number 18 coating rod to form Films A and B respectively.

Film A was exposed through the polyester base to infra-red radiation from a GaAlAs semiconductor diode laser in the same way as in Example 1 above. Following the infra-red exposure, the entire coated side of Film A was exposed to the unfiltered output of a low pressure mercury UV lamp, model B-100 (supplied by Black Light Eastern, a division of Spectronics Corporation, Westbury, Long Island, N.Y.) for 47 seconds. Film A was next heated on a hotplate at 117° C. for 15 seconds, after which it was laminated at 240° F. (116° C.) and 60 psi (0.4 MPa) to Film B, with the two coated sides in contact. Table 2 below shows the green optical densities achieved for various infra-red exposures; these densities were measured using an X-Rite 310 photographic densitometer, supplied by X-Rite, Inc., Grandville, Mich., with the appropriate filter.

TABLE 2

| Scanning speed (m/sec) | Exposure (mJ cm$^{-2}$) | Green optical density |
| --- | --- | --- |
| No IR exposure | 0 | 0.07 |
| 2.0 | 119 | 2.68 |
| 2.5 | 95 | 2.81 |
| 3.0 | 79 | 2.73 |
| 3.5 | 68 | 2.69 |
| 4.0 | 60 | 2.95 |

From the data in Table 1, it will be seen that the green optical density achieved in the imaged areas was independent of the exposure within the range shown in Table 2. Further experiments showed that at lower exposures, very little magenta dye density developed, presumably because so little superacid was generated during the infra-red irradiation that, even after the ultra-violet irradiation, the quantity of superacid generated did not exceed the threshold required to protonate all the infra-red dye and hence leave free superacid present in the infra-red exposed areas. Accordingly, at these low exposures, even in the infra-red exposed areas, there was no free superacid available to catalyze the decomposition of the acid generator, so little or no production of the second acid took place and little magenta color developed.

Further experiments also showed that if the ultra-violet exposure was less than 40 or more than 55 seconds, no significant difference in optical density was seen between the areas which had received infra-red irradiation and those which had not; if the ultra-violet irradiation was too short, little or no dye density developed in any part of the film, while if the ultra-violet irradiation was too long, the whole film developed the maximum dye density. Presumably, if the ultra-violet irradiation is too short, and thus too little iodonium salt is decomposed during this irradiation, even in infra-red exposed areas the quantity of superacid present following the ultra-violet irradiation will not exceed the threshold. Thus, no free superacid will be present in the infra-red exposed areas during the heating step, no acid amplification will occur, and little or no magenta dye density will result. On the other hand, if the ultra-violet irradiation is too long, too much iodonium salt is decomposed during this irradiation, even in areas not exposed to infra-red radiation. In this case, the quantity of superacid present following the ultra-violet irradiation will everywhere exceed the threshold, free superacid will be present throughout the film, and acid amplification and dye color change will occur in all areas.

EXAMPLE 3

Imaging Process of the Invention Using a Single Sheet Medium

This Example illustrates an imaging process of the invention generally similar to that in Example 2 above, but in which the imaging medium comprises a single sheet rather than two sheets laminated together following the ultra-violet irradiation.

Two dispersions were prepared as follows:

Dispersion A:

De-ionized water (60 mL) was added dropwise to a magnetically stirred solution of a surfactant (Aerosol TR-70, adjusted with potassium hydroxide to pH 6, 0.65 g), the leuco dye used in Example 2 above (2.5 g), a base (HALS-62, supplied by Fairmount Chemical Company, 0.25 g) and a polymeric binder (Elvacite 2043, supplied by DuPont de Nemours, Wilmington, Del., 2.75 g) in dichloromethane (46 mL). The resultant, very viscous mixture was sonicated, causing the viscosity to decrease, and then the mixture was allowed to stir overnight at room temperature, during which time the dichloromethane evaporated. A fluorinated surfactant (FC-120, supplied by Minnesota Mining and Manufacturing Corporation, St. Paul, Minn., 56 mg of a 25% aqueous solution) was then added.

Dispersion B:

De-ionized water (53.5 mL) was added dropwise to a magnetically stirred solution of a surfactant (Aerosol TR-70, adjusted with potassium hydroxide to pH 6, 0.58 g), a base (HALS-63, supplied by Fairmount Chemical Company, 2.45 g) and a polymeric binder (Elvacite 2043, supplied by DuPont de Nemours, 2.45 g) in dichloromethane (53.5 g). The resultant, very viscous mixture was sonicated, causing the viscosity to decrease, and then the mixture was allowed to stir overnight at room temperature, during which time the dichloromethane evaporated.

2 mL of Dispersion A was then combined with 1 mL of Dispersion B and poly(vinyl alcohol) (Vinol 540, supplied by Air Products Corporation, Allentown, Pa., 1 mL of 5% aqueous solution). The resultant coating fluid was then overcoated, using a number 8 coating rod, on to Film A prepared in Example 2 above.

The imaging medium thus prepared, which comprised a single sheet having both an acid-generating layer and a color-forming layer, was exposed through the polyester base to infra-red radiation from a GaAlAs laser in the same manner as in Example 1 above. Following this infra-red irradiation, the entire coating was exposed for 200 seconds, through the polyester base, to ultraviolet radiation from the aforementioned low pressure mercury UV lamp, model B-100 equipped with a 365 nm interference filter (supplied by Corion Corporation, Holliston, Mass.). The power measured at the film plane in the arrangement used was 0.3 mW/cm$^2$. The coating was then heated on a hotplate at 115° C. for 60 seconds. Table 3 below shows the green optical density achieved for various infra-red exposures, measured in the same manner as in Example 1 above.

TABLE 3

| Scanning speed (m/sec) | Exposure (mJ cm$^{-2}$) | Green optical density |
|---|---|---|
| No IR exposure | 0 | 0.03 |
| 2.0 | 119 | 1.04 |
| 2.5 | 95 | 1.34 |
| 3.0 | 79 | 1.35 |
| 3.5 | 68 | 0.97 |
| 4.0 | 60 | 0.41 |

From the data in Table 3, it will be seen that the optical density achieved was independent of exposure only for exposures above 68 mJ cm$^{-2}$. Presumably, at lower exposures, too little iodonium salt is decomposed during the infra-red irradiation, so that even in infra-red exposed areas the quantity of superacid present following the ultra-violet irradiation will not exceed the threshold. Thus, little or no free superacid will be present in the infra-red exposed areas during the heating step, little or no acid amplification will occur, and little or no increase in magenta dye density will result.

EXAMPLE 4

This Example illustrates acid generation by a process of the present invention.

A coating solution was prepared by dissolving 1,3-bis[(2,6-di-t-butyl-4H-thiopyran-4-ylidene)methyl]-2,4-dihydroxy-dihydroxide-cyclobutene diyliumbis{inner salt} (approximately 0.5 mg; see the aforementioned U.S. Pat. No. 4,508,811), 4-(n-octyloxy)phenyl phenyl iodonium hexafluoroantimonate (5 mg) and the same acid indicator dye as in Example 2, Fluid B above (10 mg; this indicator dye produces a magenta dye in the presence of acid) in 1.00 ml of a 10% w/v solution of poly($\alpha$-methylstyrene) in dichloromethane. This coating solution was coated under dim green light on raw 4 mil (101 $\mu$m) poly(ethylene terephthalate) film (Mylar X4C1, supplied by E. I. DuPont de Nemours & Co., Inc, Wilmington, Del.) using a number 24 coating rod. During coating, the film was supported on a warm aluminum plate covered with several layers of paper. The coated film was stored in light-tight envelopes and allowed to dry overnight in an evacuated chamber.

Samples of the dried film were exposed to light from a 150 W xenon lamp filtered with a near infra-red bandpass filter (an RT-830 filter, supplied by Hoya Optics, Inc., Fremont, Calif.) and an 820 nm interference filter (10 nm bandwidth, three cavity, supplied by Omega Optical Inc., Brattleboro, Vt.) for periods of 2, 2, 2, 4 and 10 minutes, successively. The light power, measured with a calibrated photodiode, was 1.55 mW/cm$^2$. The visible/near-infrared absorption spectrum of the film was measured before and after each irradiation with a Hewlett-Packard HP 8452A diode array spectrophotometer.

The quantum yield for acid photogeneration was calculated by dividing the number of moles of the indicator dye protonated during the irradiation (determined from the absorbance change at 554 nm due to the protonated indicator dye and the area irradiated) by the number of moles of 820 nm photons absorbed by the film (determined from the incident light intensity, the irradiation wavelength, the exposure time, and the average film absorptance at 820 nm during the irradiation). The quantum yield for dye photobleaching was calculated in a similar manner, using the absorbance decrease at the wavelength of the dye near infrared absorbance maximum. It is observed for all samples that dye photobleaching always accompanies acid photogeneration.

More specifically, for each exposure, the number of moles of acid photogenerated, $\zeta_H$, is given by:

$$\zeta_H = \Delta A_{\lambda HIn}\alpha/10^3 \epsilon_{\lambda HIn}$$

where $\Delta A_{\lambda HIn}$, is the difference (after exposure minus before exposure) in the indicator dye absorbance at $\lambda_{HIn}$, the wavelength of maximum absorption (554 nm) of the protonated form of the indicator dye, $\alpha$ is the area of the exposed film (in cm$^2$) and $\epsilon_{\lambda HIn}$ is the molar absorptivity of this species at that wavelength (the unprotonated form of the indicator dye does not absorb at this wavelength). The number of moles of infra-red dye photobleached, $\zeta_F$, is given by:

$$\zeta_F = \Delta A_{\lambda max}\alpha/10^3 \epsilon_{\lambda max}$$

where $\Delta A_{\lambda max}$ is the difference in dye absorbance at $\lambda_{max}$, the wavelength of maximum absorption (824 nm) of the infra-red dye, and $\epsilon_{\lambda max}$ is the molar absorptivity of the infra-red dye at $\lambda_{max}$. The number of photons, $\Omega$, absorbed by the film is given by:

$$\Omega = \frac{Pt\alpha\lambda_1}{hcL_0}(1 - 10^{-A\lambda_1^{avg}})$$

where P is the light intensity (in watts cm$^{-2}$), t is the time during which the light is applied to the film, $\lambda_1$ (820 nm) is the wavelength of the light, $A_{\lambda 1}^{avg}$ is the average absorbance of the film at $\lambda_1$ during exposure, h is Planck's constant, c is the speed of light, and $L_0$ is Avagadro's number. In this Example, $\lambda_{max}$ was 824 nm, $\epsilon_{\lambda max}$ was $2.5\times10^5$M$^{-1}$cm$^{-1}$, $\epsilon_{\lambda HIn}$, was $1.0\times10^5$M$^{-1}$cm$^{-1}$, and P was found to be 1.55 mW cm$^{-2}$ using a calibrated photodiode.

As is commonly seen for photochemical reactions in non-fluid polymer binders, in this and subsequent Examples the quantum yield of the dye photobleaching and acid photogeneration depended on the extent of the photoreaction. Consequently, the photoreaction yields are quoted for an amount of exposure at which approximately $1.0\times10^{-6}$ moles of photons cm$^{-2}$ were absorbed by the film. For this film, the acid photogeneration quantum yield at this exposure was $1.18\times10^{-4}$ (the infra-red dye photobleaching quantum yield was $4.18\times10^{-4}$).

EXAMPLE 5

Control Example

This Example illustrates that infra-red dyes lacking a hydrogen atom on the meso carbon atoms are not effective in acid generation by the process of the present invention.

Example 4 was repeated except that the infra-red dye used in that Example was replaced by the corresponding dye in which both meso hydrogen atoms were replaced by methyl groups and that the irradiation wavelength was 880 nm. The quantum yields for both infra-red dye photobleaching and acid photogeneration were less than $10^{-6}$.

EXAMPLE 6

This Example illustrates a process of the present invention using an asymmetric infra-red dye.

Example 4 was repeated except that the infra-red dye used in that Example was replaced by the dye of formula:

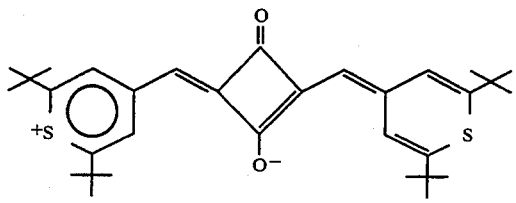

(which is identical to the dye used in Example 4 except that one thiopyrylium moiety has been replaced by a pyrylium moiety) and that the irradiation wavelength was 779 nm. The quantum yield for acid photogeneration was $4.99 \times 10^{-4}$ (that for infra-red dye photobleaching was $9.36 \times 10^{-4}$).

EXAMPLE 7

This Example illustrates a process of the present invention using a bis(benzpyrylium) infra-red dye.

Example 4 was repeated except that the infra-red dye used in that Example was replaced by the dye of formula:

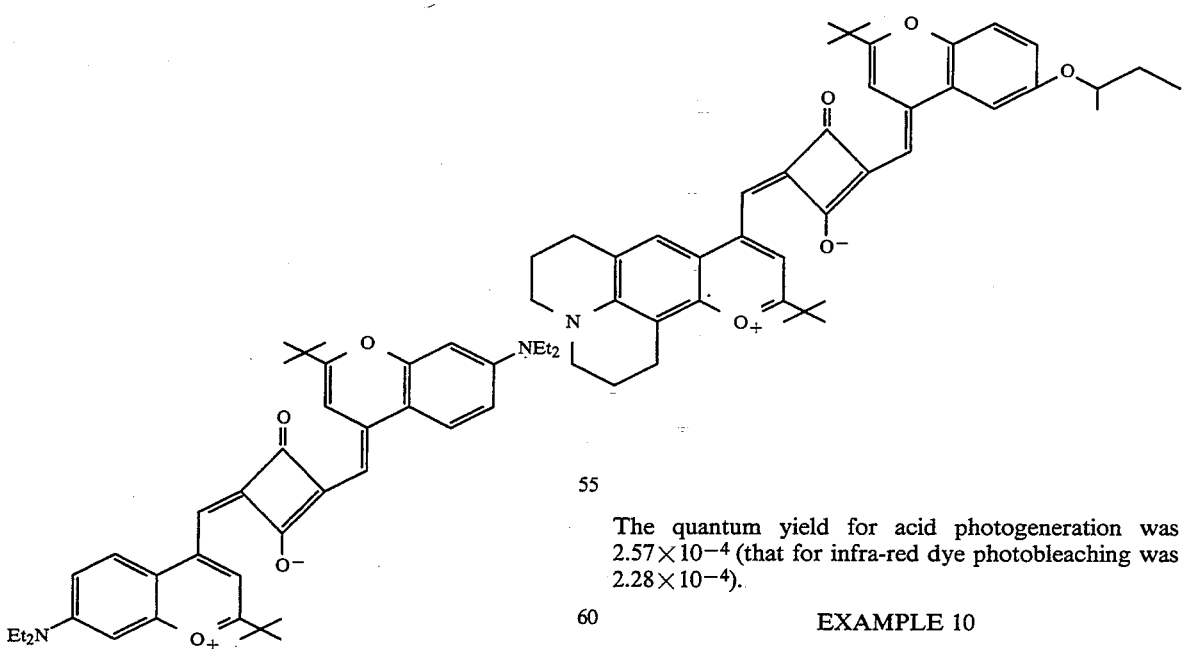

and that the poly(α-methylstyrene) binder was replaced by poly(vinyl chloride) (OxyChem 160, supplied by Occidental Chemical Co., 5005 LBJ Freeway, Dallas, Tex. 75244). The quantum yield for acid photogeneration was $2.12 \times 10^{-4}$ (that for infra-red dye photobleaching was $5.46 \times 10^{-4}$).

EXAMPLE 8

This Example illustrates a process of the present invention using an infra-red dye in which the squarylium ring carries a 2-sulfonamido substituent.

Example 4 was repeated except that the infra-red dye used in that Example was replaced by the dye of formula:

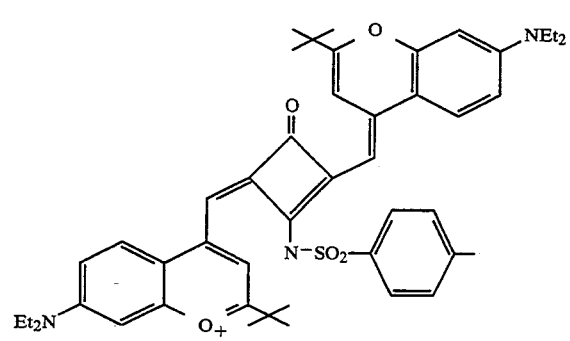

The quantum yield for acid photogeneration was $2.35 \times 10^{-4}$ (that for infra-red dye photobleaching was $5.21 \times 10^{-4}$).

EXAMPLE 9

This Example illustrates a process of the present invention using a julolidine infra-red dye.

Example 4 was repeated except that the infra-red dye used in that Example was replaced by a dye of formula:

The quantum yield for acid photogeneration was $2.57 \times 10^{-4}$ (that for infra-red dye photobleaching was $2.28 \times 10^{-4}$).

EXAMPLE 10

Laser Imaging of Medium

This Example illustrates a process generally similar to that of Example 4 above, but in which the medium is imaged with a laser.

An imaging medium was prepared in the same way as in Example 4 above, but using the infra-red dye of Example 8 above, an indicator dye of the formula:

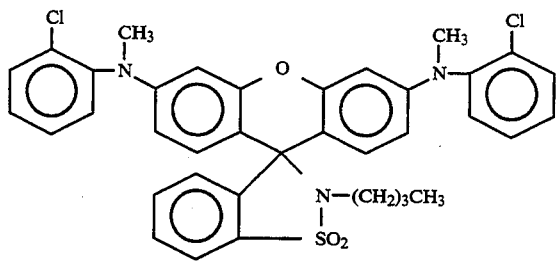

and substituting 2-butanone for dichloromethane. The imaging medium was then imaged with a laser in a manner similar to that used in Example 1 above, except that the semiconductor laser used emitted at 819 nm, and delivered 107 mW to the medium. The pitch used was 40 μm.

The formula used to calculate dye photobleaching in this experiment was the same as in Example 4 above but, since the medium sample only covered a fraction F of the circumference of the drum, the formula for the number of photons absorbed by the film must be modified to:

$$\Omega = \frac{Pt\lambda_1 F}{hcL_0}(1 - 10^{-A\lambda_1 c\gamma_6})$$

where t is now the time during which the laser is on, and P is the laser power in watts. $\epsilon_{HIn} = 1.35 \times 10^5\,M^{-1}\,cm^{-1}$ for the indicator dye used in this Example.

The quantum yield for acid photogeneration at a laser scanning speed of 5 m/s was $4.14 \times 10^{-4}$ (that for infra-red dye photobleaching was $1.12 \times 10^{-3}$ at the same speed). The higher quantum yields in this laser-imaging experiment, as compared with the lamp-imaged experiment for the same infra-red dye (see Example 8 above) are probably attributable to the increase in the temperature of the imaging medium during laser imaging.

From the foregoing, it will be seen that the present invention provides a process for generation of acid which can be used to cause a variety of physicochemical changes, and is especially useful in imaging media.

We claim:

1. An acid-generating medium comprising:
   a diaryl iodonium salt; and
   a squarylium dye capable of absorbing infra-red radiation having a wavelength within the range of 700 to 1200 nm, the dye having a squarylium ring the 1- and 3-positions of which are each connected, via a single $sp^2$ carbon atom, to a pyrylium, thiopyrylium, benzpyrylium or benzthiopyrylium moiety, at least one of the $sp^2$ carbon atoms having a hydrogen atom attached thereto, and the 2-position of the squarylium ring bearing an $O^-$, amino or substituted amino, or sulfonamido group.

2. A medium according to claim 1 wherein the 2-position of the squarylium ring bears an amino or substituted amino group, and at least one of the pyrylium, thiopyrylium, benzpyrylium or benzthiopyrylium moieties bears at least one electron-donating substituent.

3. A medium according to claim 1 wherein the infra-red dye has an oxidation potential in dichloromethane not greater than about 500 mV relative to a standard calomel electrode.

4. A medium according to claim 1 wherein the diaryl iodonium salt is an alkoxyphenyl phenyl iodonium salt.

5. A medium according to claim 4 wherein the alkoxyphenyl phenyl iodonium salt is octyloxyphenyl phenyl iodonium hexafluoroantimonate.

6. A medium according to claim 1 further comprising a binder selected from the group consisting of polystyrene, poly(α-methylstyrene) and poly(vinyl chloride).

7. A medium according to claim 1 wherein, in the infra-red dye, one of said $sp^2$ carbon atoms does not bear a hydrogen atom.

8. A medium according to claim 1 wherein the two pyrylium, thiopyrylium, benzpyrylium or benzthiopyrylium moieties are different from one another.

9. A medium according to claim 1 wherein at least one of the pyrylium, thiopyrylium, benzpyrylium or benzthiopyrylium moieties is a 2-substituted or 2,6-disubstituted pyrylium or thiopyrylium group, or a 2-substituted benzpyrylium or benzthiopyrylium group, wherein the or each substituent comprises an alkyl, cycloalkyl or alkoxyphenyl group.

10. A medium according to claim 1 wherein at least one of the pyrylium, thiopyrylium, benzpyrylium or benzthiopyrylium moieties is a 7-substituted benzpyrylium or benzthiopyrylium group wherein the 7-substituent is a morpholino group or a disubstituted amino group, in which each of the substituents is an alkyl or cycloalkyl group, or the two substituents on the amino group together form a polymethylene chain which, together with the nitrogen atom of the amino group, forms a heterocyclic ring, or the two substituents on the amino group are two polymethylene chains, the ends of which remote from the nitrogen atom are connected to the 6- and 8-carbon atoms of the benzpyrylium or benzthiopyrylium group.

11. A medium according to claim 1 having a first layer containing the binder, infra-red dye and diaryl iodonium salt, the first layer also comprising a depolymerizable polymer which at least partially depolymerizes in the presence of acid, the medium further comprising a layer of a porous or particulate imaging material superposed on the first layer, the layer of the imaging material having a cohesive strength greater than the adhesive strength between the imaging material and the first layer prior to depolymerization of the polymer, but less than the adhesive strength between the imaging material and the first layer after at least partial depolymerization of the polymer.

12. A medium according to claim 1 wherein the infra-red dye is of the formula:

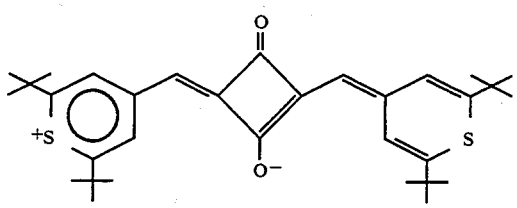

13. A medium according to claim 1 further comprising a secondary acid generator capable of being thermally decomposed to form a second acid, the thermal decomposition of the secondary acid generator being catalyzed by the superacid produced by decomposition of the diaryl iodonium salt.

14. A process for generating acid, which process comprises:
   providing a mixture of a diaryl iodonium salt and a squarylium dye capable of absorbing infra-red radiation having a wavelength within the range of 700 to 1200 nm, the dye having a squarylium ring the 1- and 3-positions of which are each connected, via a single sp² carbon atom, to a pyrylium, thiopyrylium, benzpyrylium or benzthiopyrylium moiety, at least one of the sp² carbon atoms having a hydrogen atom attached thereto, and the 2-position of the squarylium ring bearing an O⁻, amino or substituted amino, or sulfonamido group; and irradiating the mixture with infra-red radiation having a wavelength within the range of 700 to 1200 nm, thereby causing absorption of the radiation by the squarylium dye and formation of acid in the mixture.

15. A process according to claim 14 wherein the squarylium dye has an oxidation potential in dichloromethane not greater than about 500 mV relative to a standard calomel electrode.

16. A process according to claim 14 wherein the diaryl iodonium salt is an alkoxyphenyl phenyl iodonium salt.

17. A process according to claim 14 wherein the squarylium dye and the diaryl iodonium salt are dispersed in a solid polymeric binder.

18. A process according to claim 17 wherein the binder is polystyrene, poly(α-methylstyrene) or poly(vinyl chloride).

19. A process according to claim 14 wherein, in the squarylium dye, the two pyrylium, thiopyrylium, benzpyrylium or benzthiopyrylium moleties are different.

20. A process according to claim 14 wherein, in the squarylium dye, at least one of the pyrylium, thiopyrylium, benzpyrylium or benzthiopyrylium moleties is a 2-substituted or 2,6-disubstituted pyrylium or thiopyrylium group, or a 2-substituted benzpyrylium or benzthiopyrylium group, wherein the or each substituent comprises an alkyl, cycloalkyl or alkoxyphenyl group.

21. A process according to claim 14 wherein, in the squarylium dye, at least one of the pyrylium, thiopyrylium, benzpyrylium or benzthiopyrylium moleties is a 7-substituted benzpyrylium or benzthiopyrylium group wherein the 7-substituent is a morpholino group or a disubstituted amino group in which each of the substituents is an alkyl or cycloalkyl group, or the two substituents on the amino group together form a polymethylene chain which, together with the nitrogen atom of the amino group, forms a heterocyclic ring, or the two substituents on the amino group are two polymethylene chains, the ends of which remote from the nitrogen atom are connected to the 6- and 8-carbon atoms of the benzpyrylium or benzthiopyrylium group.

22. A process according to claim 14 wherein the mixture further comprises a depolymerizable polymer which at least partially depolymerizes in the presence of acid, the mixture forming the first layer of an imaging medium, this medium, this medium further comprising a layer of a porous or particulate imaging material superposed on the first layer, the layer of the imaging material having a cohesive strength greater than the adhesive strength between the imaging material and the first layer prior to depolymerization of the polymer, the process comprising imagewise exposing the imaging medium to infra-red radiation having a wavelength of 700 to 1200 nm, thereby causing absorption of the infrared radiation by the squarylium dye, generation of acid by the diaryl iodonium salt and at least partial depolymerization of the polymer in the exposed areas of the first layer, rendering these exposed areas tacky and firmly attaching exposed portions of the imaging material layer to the first layer; and removing from the first layer the portions of the imaging material in the unexposed areas, but leaving the portions of the imaging material in the exposed areas adhered to the first layer, and thereby forming an image.

23. A process according to claim 14 wherein the medium further comprises a secondary acid generator capable of being thermally decomposed to form a secondary acid, the thermal decomposition of the secondary acid generator being catalyzed by the superacid produced by decomposition of the diaryl iodonium salt, and wherein, following the imagewise irradiation with infra-red radiation, the whole medium is irradiated with actinic radiation of a wavelength shorter than the wavelength of the infra-red radiation and capable of decomposing the diaryl iodonium salt, thereby causing decomposition of part of the remaining diaryl iodonium salt, with formation of free superacid in the areas exposed to the infra-red radiation.

24. A process according to claim 14 wherein the squarylium dye is of the formula:

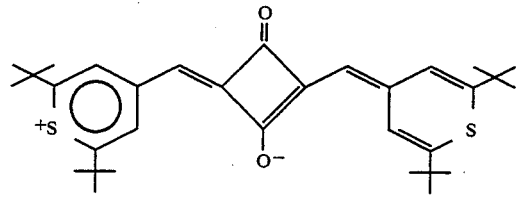

* * * * *